(12) United States Patent
Igura

(10) Patent No.: US 8,553,811 B2
(45) Date of Patent: Oct. 8, 2013

(54) LIKELIHOOD VALUE CALCULATION DEVICE, LIKELIHOOD VALUE CALCULATION METHOD, AND RADIO SYSTEM

(75) Inventor: Hiroyuki Igura, Tokyo (JP)

(73) Assignee: NEC Corporation, Tokyo (JP)

( * ) Notice: Subject to any disclaimer, the term of this patent is extended or adjusted under 35 U.S.C. 154(b) by 2 days.

(21) Appl. No.: 13/321,905

(22) PCT Filed: May 12, 2010

(86) PCT No.: PCT/JP2010/057988
§ 371 (c)(1),
(2), (4) Date: Nov. 22, 2011

(87) PCT Pub. No.: WO2010/140448
PCT Pub. Date: Dec. 9, 2010

(65) Prior Publication Data
US 2012/0069890 A1  Mar. 22, 2012

(30) Foreign Application Priority Data
Jun. 3, 2009 (JP) ................................. 2009-134057

(51) Int. Cl.
*H04L 27/06* (2006.01)
*H03K 9/00* (2006.01)
*H04L 5/12* (2006.01)
*H04L 23/02* (2006.01)
*H04L 27/00* (2006.01)

(52) U.S. Cl.
USPC ........... 375/341; 375/316; 375/262; 375/259; 375/261; 375/340

(58) Field of Classification Search
USPC .................. 375/341, 262, 324, 298, 161, 340
See application file for complete search history.

(56) References Cited

U.S. PATENT DOCUMENTS

2005/0259765 A1* 11/2005 Keller et al. .................. 375/322
2008/0232510 A1*  9/2008 Golitschek Edler Von Elbwart et al. ............................ 375/298

(Continued)

FOREIGN PATENT DOCUMENTS

JP     11-275164 A    10/1999
JP   2004153466 A     5/2004

(Continued)

OTHER PUBLICATIONS

International Search Report for PCT/JP2010/057988 mailed Jul. 6, 2010.

(Continued)

*Primary Examiner* — Chieh M Fan
*Assistant Examiner* — Michelle M Koeth

(57) ABSTRACT

A likelihood value calculation device includes: likelihood value calculation unit 201 that takes as input an equalization signal of a modulated signal, and that, in accordance with a first control signal, calculates from the equalization signal a provisional likelihood value for which the bit value of each signal point is "0" for each bit position; arithmetic inversion unit 202 that, in accordance with a second control signal, supplies for each bit position the provisional likelihood value without alteration or subjects the provisional likelihood value to arithmetic inversion and supplies the likelihood value following inversion; and operation control unit 200 that holds, for each combination of a radio mode and a modulation mode, a control pattern used to control the likelihood value calculation unit 201 and arithmetic inversion unit 202 and that generates the first and second control signals in accordance with the control pattern designated from among these control patterns.

9 Claims, 21 Drawing Sheets

(56) References Cited

U.S. PATENT DOCUMENTS

2011/0019726 A1\* 1/2011 Chappaz ................ 375/224
2011/0255559 A1\* 10/2011 Hashimoto et al. .......... 370/500

FOREIGN PATENT DOCUMENTS

| JP | 2006340309 A | 12/2006 |
|----|--------------|---------|
| JP | 2008193729 A | 8/2008 |
| JP | 2009503959 A | 1/2009 |
| WO | 2008038749 A | 4/2008 |
| WO | WO 2008/102877 A1 \* | 8/2008 |

OTHER PUBLICATIONS

D. Seethaler et al., "Low-complexity soft demodulation of MIMO-BICM using the line-search detector", Proceedings of 2005 IEEE International Conference on Communications (ICC 2005), vol. 4, 2005, pp. 2447-2451.

\* cited by examiner

LTE

WiMAX

LTE

WiMax

ISDB-T

LTE, ISDB-T bit b₃
(LTE)

bit b₀
(WiMAX)

bit b₁
(WiMAX)

bit b₂
(WiMAX)

bit b₃
(WiMAX)

bit b₀
(ISDB-T)

bit b₁
(ISDB-T)

bit b₂
(ISDB-T)

bit b3
(ISDB-T)

Likelihood value calculation of bits b0 and b1

Likelihood value calculation of bits b2 and b3

Likelihood value calculation of bits b4 and b5

Likelihood value calculation of bits b0 and b1

Likelihood value calculation of bits b2 and b3

LTE

WiMax

DQPSK bit assignment

Constellation following rotational correction (a1) Constellation points of b0

(a2) Constellation points of b0 following rotational correction (b1) Constellation points of b1

(b2) Constellation points of b1 following rotational correction (c1) Constellation points of b2

(c2) Constellation points of b2 following rotational correction

Change of an FSK constellation

Change of a constellation following rotational correction

LIKELIHOOD VALUE CALCULATION DEVICE, LIKELIHOOD VALUE CALCULATION METHOD, AND RADIO SYSTEM

TECHNICAL FIELD

The present invention relates to a likelihood value calculation device that calculates the likelihood value of a signal point based on constellation information in which the signal points (symbol data) of a digital modulated signal are mapped on a two-dimensional plane.

BACKGROUND ART

Normally, in radio baseband LSI (Large Scale Integration), an equalization process of a received baseband signal is carried out, likelihood values are calculated from the equalization signal that is obtained as a result, and a received signal is then created by performing error correction using the likelihood values that were calculated.

When a likelihood value is calculated from an equalization signal, the calculation algorithm differs according to the modulation method. For example, modulation such as FSK (Frequency Shift-Keying), BPSK (Binary Phase-Shift Keying), QPSK (Quadrature Phase-Shift Keying), 8 PSK, 16 QAM (Quadrature Amplitude Modulation), and 64 QAM are frequently used in radio systems, and the likelihood value calculation algorithms differ for each of these modulation modes.

The modulation-type discriminating circuit described in Patent Document 1 is one example of a system provided with a likelihood value calculation circuit for each modulation mode. This modulation-type discriminating circuit is provided with a plurality of likelihood calculation units connected in parallel. Each of these likelihood calculation units corresponds to a modulation type that is the object of identification. The modulation type is inferred based on the likelihood value (cumulative addition value) that was calculated in each of the likelihood value calculation units.

In Patent Document 2, transmission diversity that uses a constellation rearrangement is described. In this transmission diversity, two versions are used in which the characteristics of the rules for mapping symbol data are assumed to be in a mutually complementary relation, first diversity signals being made up from modulated symbols corresponding to one version and second diversity signals being made up from modulated symbols corresponding to the other version. A diversity effect is obtained by averaging the likelihood values for the first and second diversity signals, and the error correction capability is improved.

LITERATURE OF THE PRIOR ART

Patent Documents
 Patent Document 1: Japanese Unexamined Patent Application Publication No. 2006-340309
 Patent Document 2: Japanese Unexamined Patent Application Publication (Translation of PCT Application) No. 2009-503959

SUMMARY

In the modulation type discriminating circuit described in Patent Document 1, modulation type discriminating circuits corresponding to a plurality of modulation types can be provided because a likelihood calculation unit is provided for each modulation type. However, when the modulation types that are the object of discrimination become numerous, the amount of hardware increases to the same extent, giving rise to the problem of area overhead of the likelihood value calculation circuits.

In addition, the likelihood value calculation algorithms also differ not only by modulation type but also by the radio mode, whereby the assignment of bit values to each signal point of a constellation of a modulated signal differs for each radio mode even for the same modulation type. As a result, when constructing a system that can deal with a plurality of radio modes, likelihood value calculation circuits must be prepared for each radio mode even for the same modulation type.

Still further, when dealing with a variety of radio modes, there will be a variety of combinations in the assignment of bit values of each constellation of modulated signals, and a likelihood value calculation circuit must therefore be provided for each of these combinations.

Accordingly, when constructing a system that deals with a variety of radio modes and modulation modes, such factors as the combinations of modulation modes and radio modes and combinations for the assignment of bit values must be taken into consideration, and a likelihood calculation circuit must be provided for each of these combinations. In such cases, the amount of hardware is further increased, and the area overhead of the likelihood value calculation circuits also becomes great.

The transmission diversity described in Patent Document 2 is capable of dealing with changes in the bit assignment within the same modulation mode but encounters difficulties in coping with a variety of radio modes and modulation modes. In order to cope with a variety of radio modes and modulation modes, a likelihood value calculation circuit must be provided for each of the above-described combinations, giving rise to the problem of increase in the amount of hardware and area overhead of the likelihood value calculation circuits.

It is therefore an object of the present invention to provide a likelihood value calculation device, a likelihood value calculation method, and a radio system that can cope with a variety of radio modes and modulation modes in radio baseband processing and thereby provide a solution to the above-described problems.

To achieve the above-described object, the likelihood value calculation device of the present invention includes:

a likelihood value calculation unit that: takes as input an equalization signal of a modulated signal that is prescribed by a constellation in which signal points are mapped onto a two-dimensional plane composed of an I-axis and a Q-axis, and moreover, a value composed of a bit sequence is assigned to each signal point; selects according to a first control signal one or both of the I-axis component and Q-axis component of the equalization signal that was received as input; and, based on the selected component, calculates provisional likelihood values in which the bit value of each of the signal points is 0 for each bit position of the bit sequence;

an arithmetic inversion unit that, according to a second control signal, supplies as output without alteration the provisional likelihood value that was supplied as output from the likelihood value calculation unit for each of the bit positions, or subjects the provisional likelihood value that was supplied as output from the likelihood value calculation unit to arithmetic inversion based on an inversion position that is designated on the two-dimensional plane and supplies the likelihood value that follows inversion as output; and an operation control unit that holds control patterns that are used to control the operations of at least the likelihood value calculation unit and the arithmetic inversion unit for each combination of a radio mode and modulation mode and that generates the first and second control signals in accordance with a control pattern that was designated from among these control patterns.

The likelihood value calculation method of the present invention includes:

receiving an equalization signal of a modulated signal that is prescribed by a constellation in which signal points are mapped onto a two-dimensional plane composed of an I-axis and a Q-axis, and moreover, a value composed of a bit sequence is assigned to each signal point;

in accordance with a first control signal, selecting one or both of the I-axis component and Q-axis component of the equalization signal that was received, and based on the component that was selected, calculating a provisional likelihood value in which the bit value of each of the signal points is 0 for each bit position of the bit sequence;

in accordance with a second control signal, supplying as output the provisional likelihood value without alteration for each of the bit positions, or subjecting the provisional likelihood value to arithmetic inversion based on inversion positions designated on the two-dimensional plane and supplying as output the likelihood value that follows inversion; and holding, for each combination of a radio mode and modulation mode, a control pattern that is used to control the operations of at least the calculation of the provisional likelihood values and the arithmetic inversion and generating the first and second control signals in accordance with a control pattern that was designated from among the control patterns that are held.

The radio system of the present invention includes: the above-described likelihood value calculation device; and a control device that holds parameters that are used to control the operations of the likelihood value calculation device for each combination of a radio mode and modulation mode and that sets parameters that correspond to the combination of radio mode and modulation mode that is being used to the likelihood value calculation device.

EXPLANATION OF REFERENCE NUMBERS 101 equalization signal rotation unit
102 likelihood value calculation unit
103 arithmetic inversion unit
104 likelihood value accumulation unit
105 operation control unit Exemplary Embodiment An exemplary embodiment of the present invention is next described with reference to the accompanying drawings.

The relation between the radio mode and the bit assignment to each signal point (constellation point) of a constellation is first described.

Figure 2A:
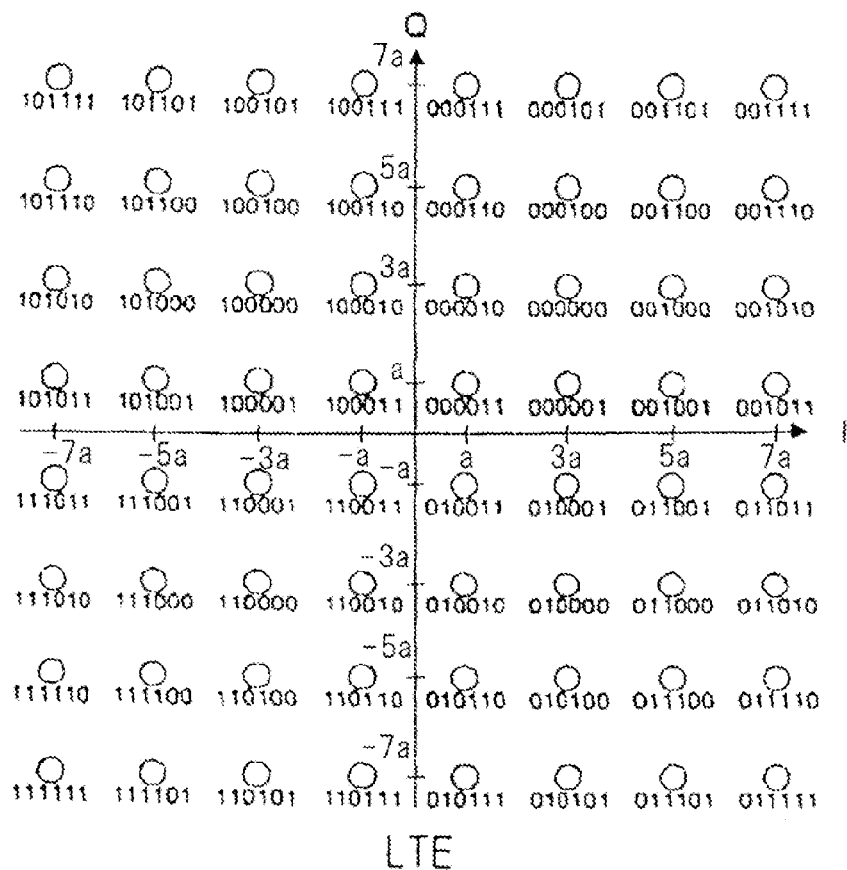
FIG. 2A is a schematic view for describing the bit assignment to each signal point of a constellation when 64QAM modulation is used in an LTE system.
Figure 2B:
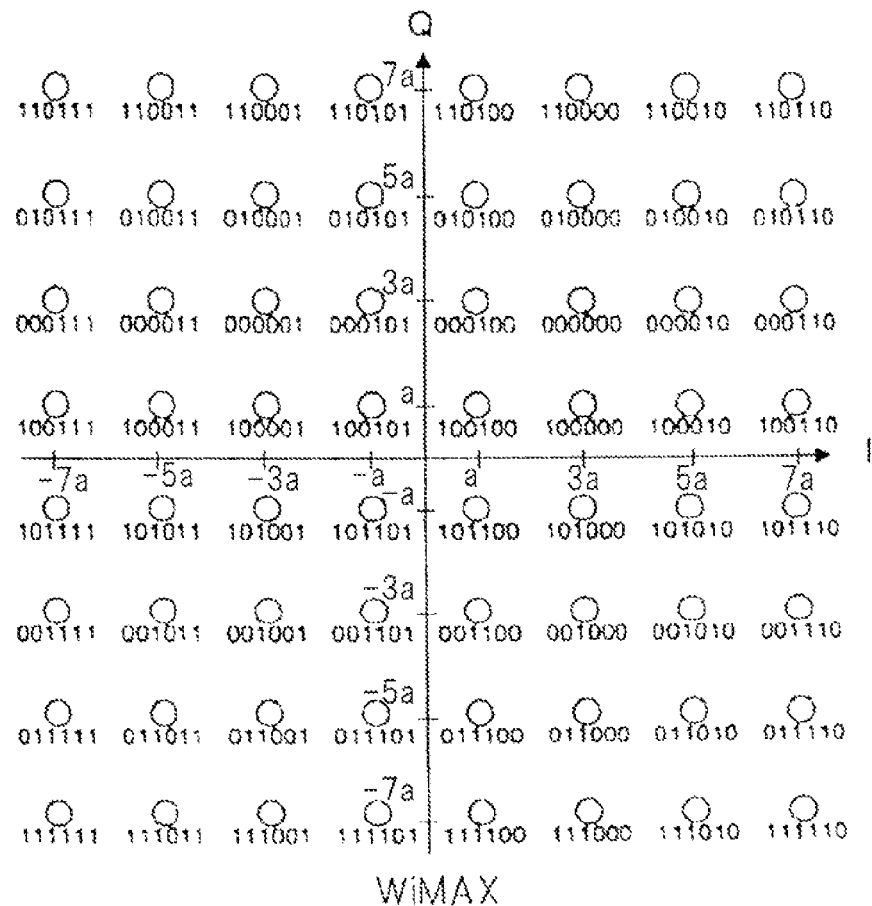
FIG. 2B is a schematic view for describing the bit assignment to each signal point of a constellation when 64QAM modulation is used in a WiMAX system.

FIG. 2A shows bit assignment to each signal point of a constellation when 64 QAM modulation is used in a radio system that adopts LTE (Long Term Evolution), which is a portable telephone communication standard. FIG. 2B shows bit assignment to each signal point of a constellation when 64 QAM modulation is used in a radio system that adopts WiMAX (Worldwide Interoperability for Microwave Access), which is one standard for radio communication.

The drawings shown in FIGS. 2A and 2B are signal space diagrams (drawings in which each signal point realized by digital modulation is represented on a two-dimensional complex plane) in which the Q-axis is the vertical axis and the I-axis is the horizontal axis, each signal point being given a binary numerical value. The binary values are 6-bit values, and in this case, the bits of each position are prescribed as b0, b1, b2, b3, b4, and b5 from the left.

Figure 3A:
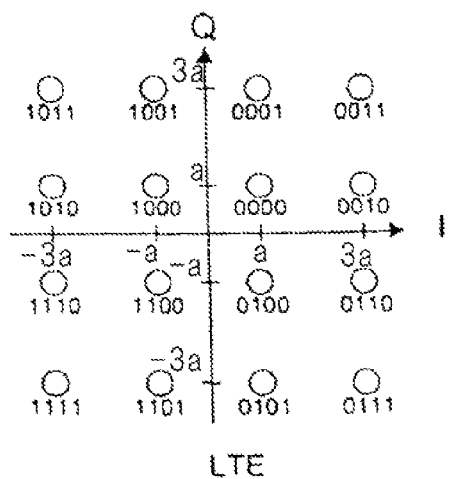
FIG. 3A is a schematic view for describing bit assignment to each signal point of a constellation when 16QAM modulation is used in an LTE system.
Figure 3B:
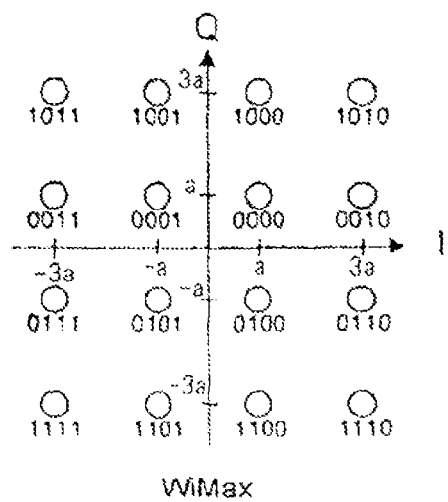
FIG. 3B is a schematic view for describing bit assignment to each signal point of a constellation when 16QAM modulation is used in a WiMAX system.
Figure 3C:
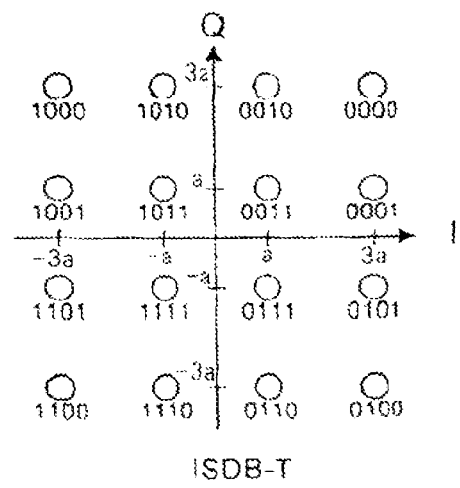
FIG. 3C is a schematic view for describing bit assignment to each signal point of a constellation when 16QAM modulation is used in an ISDB-T system.

FIG. 3A shows bit assignment to each signal point of a constellation when 16 QAM modulation is used in an LTE radio system. FIG. 3B shows bit assignment to each signal point of a constellation when 16 QAM is used in a WiMAX radio system. FIG. 3C shows bit assignment to each signal point of a constellation when 16 QAM modulation is used in a radio system that adopts ISDB-T (Integrated Service Digital Broadcasting), which is one digital broadcast mode.

In the signal space diagrams shown in FIGS. 3A-3C, a 4-bit numerical value is given to each signal point. Here, the bits of each position are prescribed as b0, b1, b2, and b3 from the left.

Figure 4A:
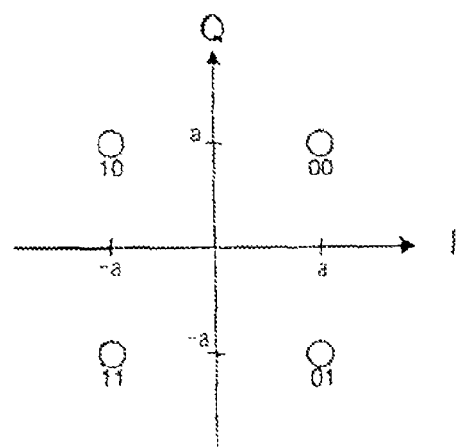
FIG. 4A is a schematic view for describing the bit assignment to each signal point of a constellation when QPSK modulation is used in an LTE or ISDB-T system.
Figure 4B:
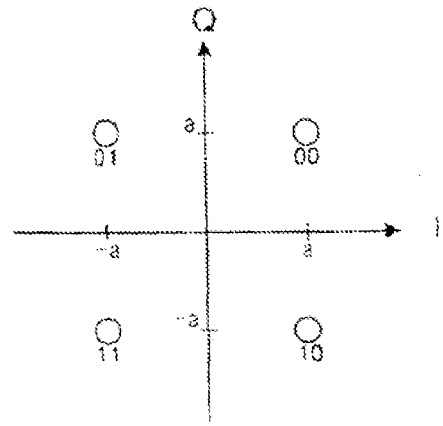
FIG. 4B is a schematic view for describing the bit assignment to each signal point of a constellation when QPSK modulation is used in a WiMAX system.

FIG. 4A shows bit assignment to each signal point of a constellation when QPSK modulation is used in an LTE or ISDB-T radio system. FIG. 4B shows bit assignment to each signal point of a constellation when QPSK modulation is used in a WiMAX radio system.

In the signal space diagrams shown in FIGS. 4A and 4B, a 2-bit numerical value is given to each signal point. Here, the bits of each position are prescribed as b0 and b1 from the left. As shown in FIGS. 2A and 2B, FIGS. 3A-3C, and FIGS. 4A and 4B described above, bit assignment to each constellation differs for each radio system even with the same type of modulation.

Figure 5A:
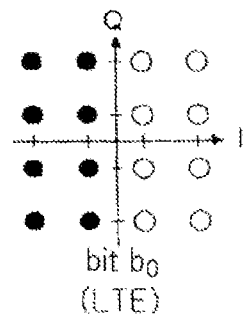
FIG. 5A is a schematic view showing the constellation arrangement of bit b0 when 16QAM modulation is used in an LTE system.

FIG. 5A shows the constellation arrangement relating to bit b0 in the LTE system of 16 QAM modulation shown in FIG. 3A. In the constellation arrangement shown in FIG. 5A, of each of the signal points of the signal space diagram shown in FIG. 3A, signal points for which the value of bit b0 is "1" are shown as black dots, and signal points for which the value of bit b0 is "0" are shown as white dots. The signal points of the second quadrant and third quadrant are all set to black dots, and the signal points of the first quadrant and fourth quadrant are all set to white dots.

Figure 5B:
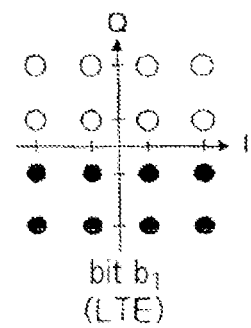
FIG. 5B is a schematic view showing the constellation arrangement of bit b1 when 16QAM modulation is used in an LTE system.

FIG. 5B shows the constellation arrangement relating to bit b1 in the LTE system of 16 QAM modulation shown in FIG. 3A. In the constellation arrangement shown in FIG. 5B, of each of the signal points of the signal space diagram shown in FIG. 3A, signal points for which the value of bit b1 is "1" are shown as black dots, and signal points for which the value of bit b1 is "0" are shown as white dots. The signal points of the first quadrant and the second quadrant are all set to white dots, and the signal points of the third quadrant and the fourth quadrant are all shown as black dots.

Figure 5C:
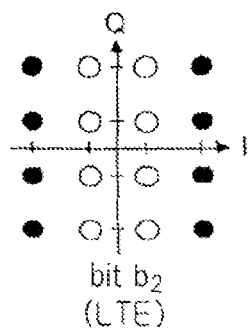
FIG. 5C is a schematic view showing the constellation arrangement of bit b2 when 16QAM modulation is used in an LTE system.

FIG. 5C shows the constellation arrangement relating to bit b2 in the LTE system of 16 QAM modulation shown in FIG. 3A. In the constellation arrangement shown in FIG. 5C, of each of the signal points of the signal space diagram shown in FIG. 3A, signal points for which the value of bit b2 is "1" are shown as black dots, and signal points for which the value of bit b2 is "0" are shown as white dots. The arrangement of the white dots and black dots has line symmetry with the Q-axis as a reference.

Figure 5D:
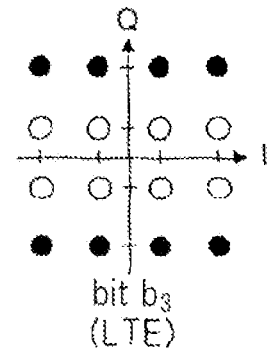
FIG. 5D is a schematic view showing the constellation arrangement of bit b3 when 16QAM modulation is used in an LTE system.

FIG. 5D shows the constellation arrangement relating to bit b3 in the LTE system of 16 QAM modulation shown in FIG. 3A. In the constellation arrangement shown in FIG. 5D, of each of the signal points of the signal space diagram shown in FIG. 3A, signal points for which the value of bit b3 is "1" are shown as black dots, and signal points for which the value of bit b3 is "0" are shown as white dots. The arrangement of white dots and black dots has line symmetry with the I-axis as a reference.

Figure 5E:
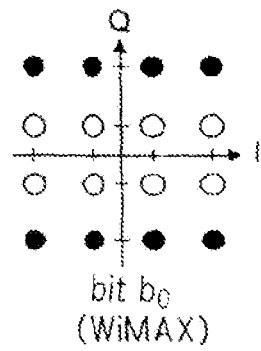
FIG. 5E is a schematic view showing the constellation arrangement of bit b0 when 16QAM modulation is used in a WiMAX system.

FIG. 5E shows the constellation arrangement relating to bit b0 in the WiMAX system of 16 QAM modulation shown in FIG. 3B. In the constellation arrangement shown in FIG. 5E, of each of the signal points of the signal space diagram shown in FIG. 3B, signal points for which the value of bit b0 is "1" are shown as black dots, and signal points for which the value of bit b0 is "0" are shown as white dots. The arrangement of white dots and black dots has line symmetry with the I-axis as reference.

Figure 5F:
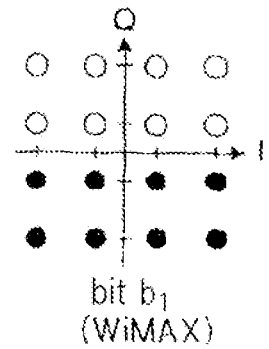
FIG. 5F is a schematic view showing the constellation arrangement of bit b1 when 16QAM modulation is used in a WiMAX system.

FIG. 5F shows the constellation arrangement relating to bit b1 in the WiMAX system of 16 QAM modulation shown in FIG. 3B. In the constellation arrangement shown in FIG. 5F, of each of the signal points of the signal space diagram shown in FIG. 3B, signal points for which the value of bit b1 is "1" are shown as black dots, and signal points for which the value of bit b1 is "0" are shown as white dots. The signal points of the first quadrant and second quadrant are all set to white dots, and the signal points of the third quadrant and fourth quadrant are all set as black dots.

Figure 5G:
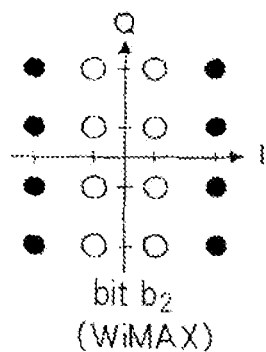
FIG. 5G is a schematic view showing the constellation arrangement of bit b2 when 16QAM modulation is used in a WiMAX system.

FIG. 5G shows the constellation arrangement relating to bit b2 in the WiMAX system of 16 QAM modulation shown in FIG. 3B. In the constellation arrangement shown in FIG. 5G, of each of the signal points of the signal space diagram shown in FIG. 3B, signal points for which the value of bit b2 is "1" are shown as black dots, and signal points for which the value of bit b2 is "0" are shown as white dots. The arrangement of white dots and black dots has line symmetry with the Q-axis as reference.

Figure 5H:
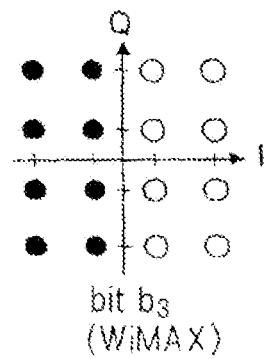
FIG. 5H is a schematic view showing the constellation arrangement of bit b3 when 16QAM modulation is used in a WiMAX system.

FIG. 5H shows the constellation arrangement relating to bit b3 in the WiMAX system of 16 QAM modulation shown in FIG. 3B. In the constellation arrangement shown in FIG. 5H, of each of the signal points of the signal space diagram shown in FIG. 3B, signal points for which the value of bit b3 is "1" are shown as black dots, and signal points for which the value of bit b3 is "0" are shown as white dots. The signal points of the second quadrant and the third quadrant are all set as black dots, and the signal points of the first quadrant and fourth quadrant are all set as white dots.

Figure 5I:
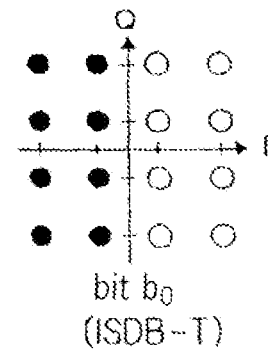
FIG. 5I is a schematic view showing the constellation arrangement of bit b0 when 16QAM modulation is used in an ISDB-T system.

FIG. 5I shows the constellation arrangement relating to bit b0 in the ISDB-T system of 16 QAM modulation shown in FIG. 3C. In the constellation arrangement shown in FIG. 5I, of each of the signal points of the signal space diagram shown in FIG. 3C, signal points for which the value of bit b0 is "1" are shown as black dots, and signal points for which the value of bit b0 is "0" are shown as white dots. The signal points of the second quadrant and third quadrant are all set to black dots, and signal points of the first quadrant and fourth quadrant are all set to white dots.

Figure 5J:
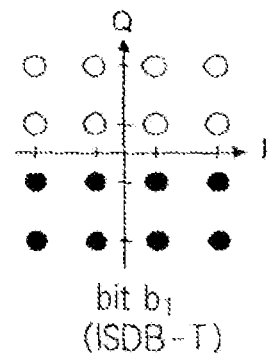
FIG. 5J is a schematic view showing the constellation arrangement of bit b1 when 16QAM modulation is used in an ISDB-T system.

FIG. 5J shows the constellation arrangement at bit b1 relating to bits in the ISDB-T system of 16 QAM modulation shown in FIG. 3C. In the constellation arrangement shown in FIG. 5J, of each of the signal points of the signal space diagram shown in FIG. 3C, signal points for which the value of bit b1 is "1" are shown as black dots, and signal points for which the value of bit b1 is "0" are shown as white dots. The signal points of the first quadrant and the second quadrant are all set to white dots, and the signal points of the third quadrant and fourth quadrant are all set as black dots.

Figure 5K:
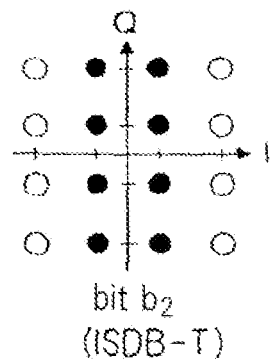
FIG. 5K is a schematic view showing the constellation arrangement of bit b2 when 16QAM modulation is used in an ISDB-T system.

FIG. 5K shows the constellation arrangement relating to bit b2 in the ISDB-T system of 16 QAM modulation shown in FIG. 3C. In the constellation arrangement shown in FIG. 5K, of each of the signal points of the signal space diagram shown in FIG. 3C, signal points for which the value of bit b2 is "1" are shown as black dots, and signal points for which the value of bit b2 is "0" are shown as white dots. The arrangement of white dots and black dots has line symmetry with the Q-axis as a reference.

Figure 5L:
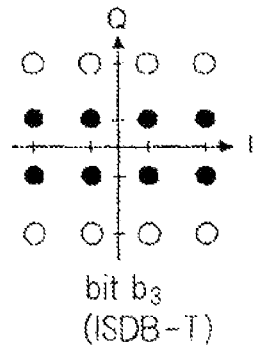
FIG. 5L is a schematic view showing the constellation arrangement of bit b3 when 16QAM modulation is used in an ISDB-T system.

FIG. 5L shows the constellation arrangement relating to bit b3 in the ISDB-T system of 16 QAM modulation shown in FIG. 3C. In the constellation arrangement shown in FIG. 5K, of each of the signal points of the signal space diagram shown in FIG. 3C, signal points for which the value of bit b3 is "1" are shown as black dots, and signal points for which the value of bit b3 is "0" are shown as white dots. The arrangement of white dots and black dots has line symmetry with the I-axis as reference.

The following points can be understood from the constellation arrangements of each bit that is assigned to signal points in each of the radio systems (LTE, WiMAX, and ISDB-T) of FIGS. 5A-5L described above.

For example, relating to bit b0 in 16 QAM modulation of an LTE system, each signal point in the first quadrant and fourth quadrant is assigned to "0," and each signal point in the second quadrant and the third quadrant is assigned to "1." In this case, the likelihood that bit b0 is "0" rises as the I-axis component of equalization signal increases and falls as the I-axis component decreases. The likelihood that bit b1 is "0" rises as the Q-axis component of the equalization signal increases. The likelihood that bit b2 is "0" rises as the absolute value of the I-axis component of the equalization signal decreases. The likelihood that bit b3 is "0" rises as the absolute value of the Q-axis component of the equalization signal decreases.

In 16 QAM modulation of a WiMAX system, on the other hand, the likelihood that bit b0 is "0" rises as the absolute value of the Q-axis component of the equalization signal decreases.

The likelihood that bit b1 is "0" rises as the Q-axis component increases. The likelihood that bit b2 is "0" rises as the absolute value of the I-axis component of the equalization signal decreases. The likelihood that bit b3 is "0" rises as the I-axis component of the equalization signal increases and falls as the I-axis component decreases.

In 16 QAM modulation of an ISDB-T system, the likelihood that bit b0 is "0" rises as the I-axis component of the equalization signal increases and falls as the I-axis component decreases. The likelihood that bit b1 is "0" rises as the Q-axis component increases. The likelihood that bit b2 is "0" rises as the absolute value of the I-axis component of the equalization signal increases. The likelihood that bit b3 is "0" rises as the absolute value of the Q-axis component of the equalization signal increases.

From the foregoing, it can be seen that the following relations exist with respect to the likelihood of each bit among each of the LTE, WiMAX, and ISDB-T radio systems.

(1) Relations of likelihood between a WiMAX system and an LTE system:

(1-1) The likelihood that bit b0 of a WiMAX system is "0" is the same as the likelihood that bit b3 of an LTE system is "0."

(1-2) The likelihood that bit b1 of a WiMAX system is "0" is the same as the likelihood that bit b1 of an LTE system is "0."

(1-3) The likelihood that bit b2 of a WiMAX system is "0" is the same as the likelihood that bit b2 of an LTE system is "0."

(1-4) The likelihood that bit b3 of a WiMAX system is "0" is the same as the likelihood that bit b0 of an LTE system is "0."

(2) Relations of likelihood between an ISDB-T system and an LTE system:

(2-1) The likelihood that bit b0 of an ISDB-T system is "0" is the same as the likelihood that bit b0 of an LTE system is "0."

(2-2) The likelihood that bit b1 of an ISDB-T system is "0" is the same as the likelihood that bit b1 of an LTE system is "0."

(2-3) The likelihood that bit b2 of an ISDB-T system is "0" is the same as the arithmetic inversion of the likelihood that bit b2 of an LTE system is "0."

(2-4) The likelihood that bit b3 of an ISDB-T system is "0" is the same as the arithmetic inversion of the likelihood that bit b3 of an LTE system is "0."

From the above-described relations, it can be seen that for 16 QAM modulation, likelihood values in a WiMAX system and ISDB-T system can be found by subjecting likelihood values of the LTE system to arithmetic inversion and substitution (swapping). These calculation methods can be applied not only between an LTE system and WiMAX system and between an LTE system and an ISDB-T system, but for other radio systems as well.

In order to maximize the error correction capability in radio systems of recent years, bit assignment to each signal point of a constellation is carried out such that the hamming distance with an adjacent signal point is "1." By using this property, the method of calculating likelihood values between an LTE system and WiMAX system or between an LTE system and a ISDB-T system such as described hereinabove can be applied to other radio systems.

In addition, the method of calculating likelihood values described above can be applied not only in 16 QAM modulation, but also in other modulation modes such QPSK and 64 QAM as well.

A method of calculating likelihood values in a plurality of modulation modes is next described.

Figure 6A:
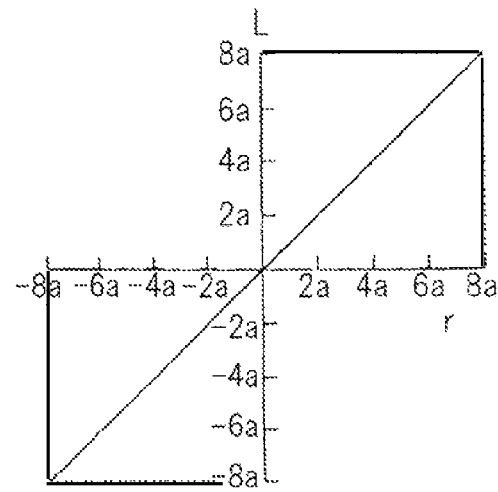
FIG. 6A shows the relation of the likelihood value and the amplitude of the equalization signal that relates to bits b0 and b1 when 64QAM modulation is used in an LTE system.
Figure 6B:
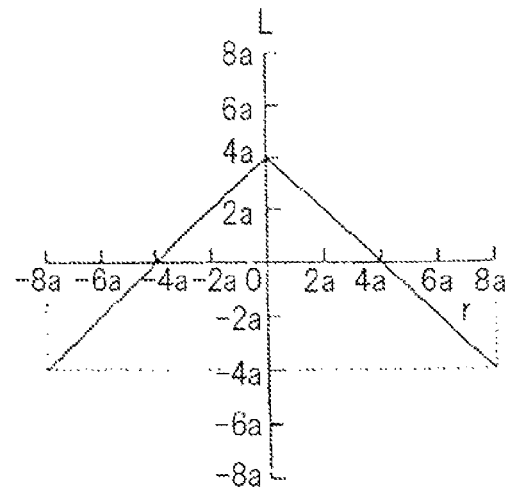
FIG. 6B shows the relation of the likelihood value and the amplitude of the equalization signal that relates to bits b2 and b3 when 64QAM modulation is used in an LTE system.
Figure 6C:
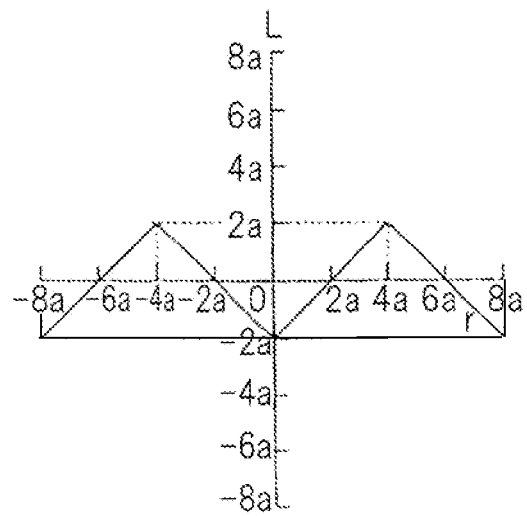
FIG. 6C shows the relation of the likelihood value and the amplitude of the equalization signal that relates to bits b4 and b5 when 64QAM modulation is used in an LTE system.

FIGS. 6A-6C shows the relation of likelihood of each bit and amplitude r (the I-axis component or the Q-axis component) of the equalization signal in an LTE system of 64 QAM modulation. Here, amplitude r indicates the I-axis component of the equalization signal relating to the likelihood values of bits b0, b2, and b4. Amplitude r indicates the Q-axis component of the equalization signal relating to the likelihood values of bits b1, b3, and b5. For example, the likelihood value of bit b0 is proportional to the I-axis component of the equalization signal, but with regard to the likelihood value of bit b4, points of inflection exist where the I-axis component is at 0, −4a, and 4a. Here, weighting coefficient a is a value that indicates the absolute value of the I-axis component (or the Q-axis component) of the signal point that is closest to the origin.

Figure 7A:
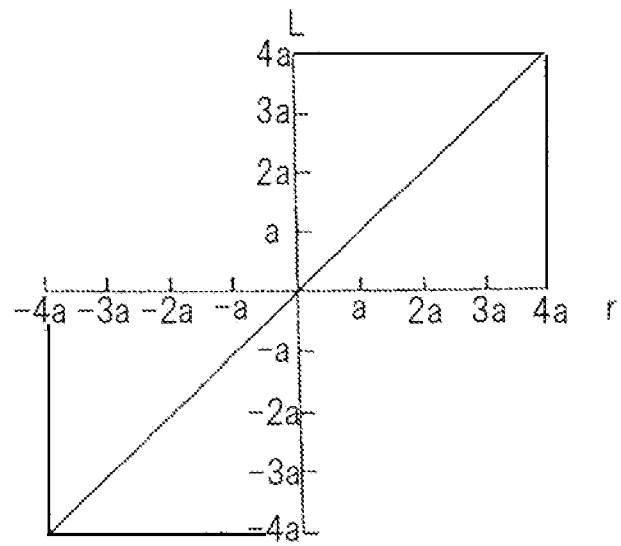
FIG. 7A shows the relation of the likelihood value and the amplitude of the equalization signal that relates to bits b0 and b1 when 16QAM modulation is used in an LTE system.
Figure 7B:
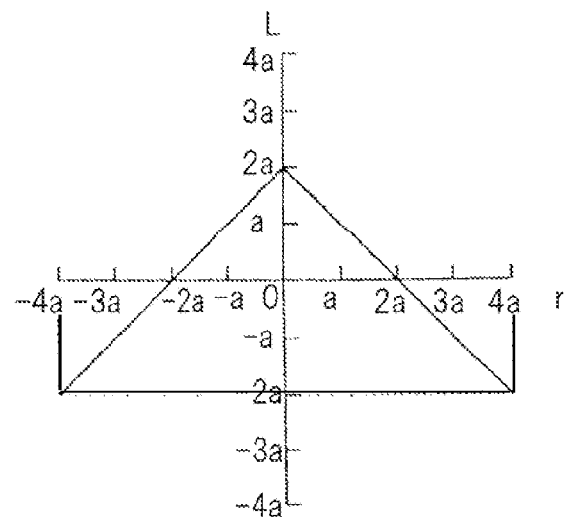
FIG. 7B shows the relation of the likelihood value and the amplitude of the equalization signal that relates to bits b2 and b3 when 16QAM modulation is used in an LTE system.

FIGS. 7A and 7B show the relation of the likelihood of each bit and amplitude r (the I-axis component or the Q-axis component) of the equalization signal in an LTE system of 16 QAM modulation. Here, amplitude r indicates the I-axis component of the equalization signal relating to the likelihood values of bits b0 and b2. Amplitude r indicates the Q-axis component of the equalization signal relating to the likelihood values of bits b1 and b3. For example, the likelihood value of bit b0 is proportional to the I-axis component of the equalization signal, but a point of inflection exists for the likelihood value of bit b2 at the point where the I-axis component is "0." Here, weighting coefficient a is a value that indicates the absolute value of the I-axis component (or the Q-axis component) of the signal point that is closest to the origin.

As can be understood from the above-described FIGS. 6A-6C and FIGS. 7A and 7B, with regard to an LTE system, the calculation of likelihood values when using 16 QAM modulation is a subset of the calculation of likelihood values when using 64 QAM modulation. Similarly, the calculation of likelihood values when using QPSK modulation is a subset of the calculation of likelihood values when using 16 QAM modulation.

In other words, when the calculation of likelihood values of 64 QAM modulation is implemented, the likelihood values of 16 QAM modulation and QPSK modulation can be calculated by slightly altering control.

In addition, it can be seen that the calculation of likelihood values in other radio systems such as WiMAX can be implemented by incorporating the previously described arithmetic inversion and substitution (swapping) to the likelihood values in an LTE system.

Figure 8A:
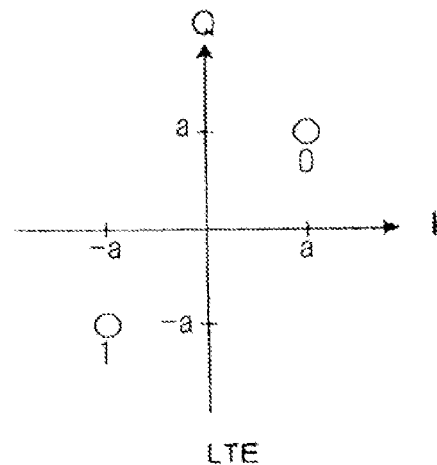
FIG. 8A is a schematic view showing the bit assignment to each signal point of a constellation when BPSK modulation is used in an LTE system.
Figure 8B:
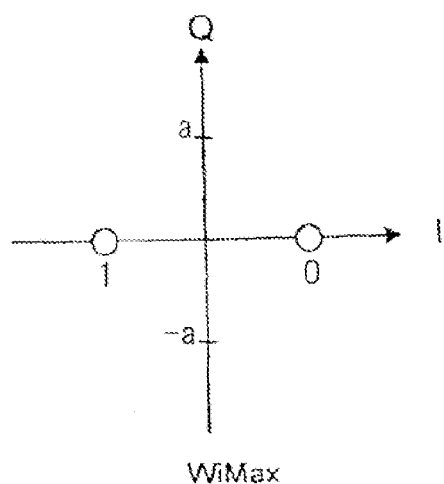
FIG. 8B is a schematic view showing the bit assignment to each signal point of a constellation when BPSK modulation is used in WiMAX system.

FIG. 8A shows the bit assignment to each signal point of a constellation in an LTE system of BPSK modulation, and FIG. 8B shows bit assignment to each signal point of a constellation in a WiMAX system of BPSK modulation.

In FIGS. 8A and 8B, a binary numerical value is given to each signal point of a constellation. The binary numerical values are shown by one-bit numerical values. From these facts, it can be seen that, in BPSK, not only bit assignment but also the position of each signal point of a constellation differs for each radio system.

When the relations shown in FIGS. 8A and 8B hold, each signal point of constellations in both an LTE system and a WiMAX system can be brought to the same position by implementing rotational correction of the equalization signal that is received as input in one of the systems. For example, when each signal point of a constellation in an LTE system of BPSK modulation is rotated clockwise exactly 45°, the signal points following rotation are identical to each signal point of a constellation in a WiMAX system of BPSK modulation. In this case, the likelihood values are values that are proportional to the I-axis component of the equalization signal, and this calculation is a subset of the likelihood value calculation of QPSK modulation.

Figure 9A:
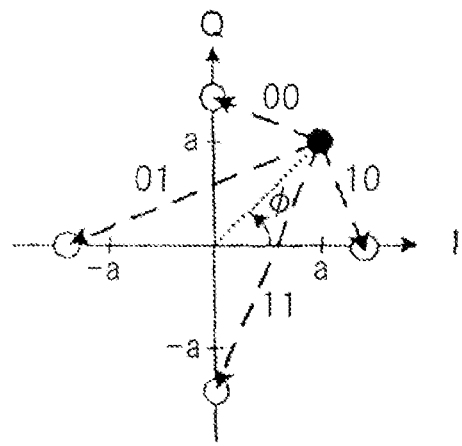
FIG. 9A is a schematic view showing the bit assignment to each signal point of a constellation in DQPSK modulation.
Figure 9B:
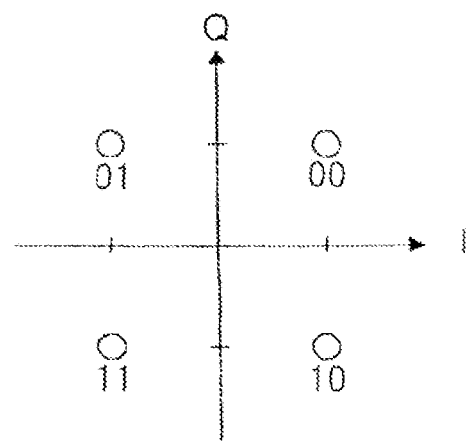
FIG. 9B is a schematic view showing each signal point after rotational correction of the constellation shown in FIG. 9A.

FIG. 9A shows bit assignment to each signal point of a constellation in DQPSK (Differential Quadrature Phase Shift Keying) modulation. FIG. 9B shows each signal point following rotational correction of the constellation shown in FIG. 9A.

As shown in FIGS. 9A and 9B, in DQPSK modulation, bit assignment is carried out according to the change in phase angle from the immediately preceding equalization signal. For example, if the phase angle of an equalization signal is rotated exactly 45° counterclockwise from the state of the immediately preceding equalization signal, {b0, b1}={0, 0} is assigned. If the phase angle is rotated exactly 135° counterclockwise from the state of the immediately preceding equalization signal, {b0, b1}={0, 1} is assigned. If the phase angle is rotated exactly 225° counterclockwise from the state of the immediately preceding equalization signal, {b0, b1}={1, 1} is assigned. If the phase angle is rotated exactly 315° counterclockwise from the state of the immediately preceding equalization signal, {b0, b1}={1, 0} is assigned.

When this type of assignment is carried out, subjecting the next equalization signal to rotational correction in the clockwise direction to the degree of the phase angle of the immediately preceding equalization signal results in the occurrence of each signal point of the constellation shown in FIG. 9B.

In other words, DQPSK likelihood values can be calculated by carrying out rotational correction and then by calculating the likelihood values at each signal point of a constellation of normal QPSK modulation.

Figure 10:
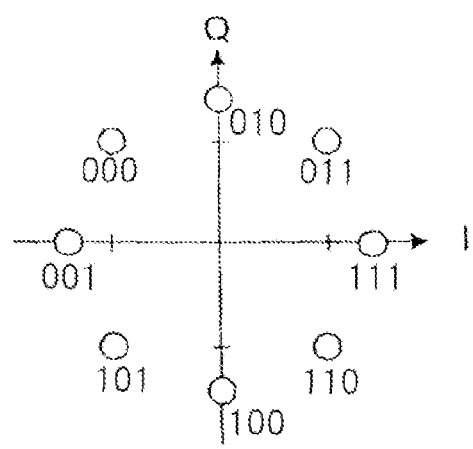
FIG. 10 is a schematic view showing bit assignment to each signal point of a constellation in 8PSK modulation.

FIG. 10 shows bit assignment to each signal point of a constellation in 8 PSK modulation. The binary numerical value beneath each signal point shows the bit assignment of that signal point. These binary numerical values are two-bit numerical values, and in this case prescribe the bit of each position as b0 and b1 from the left.

Figure 11A:
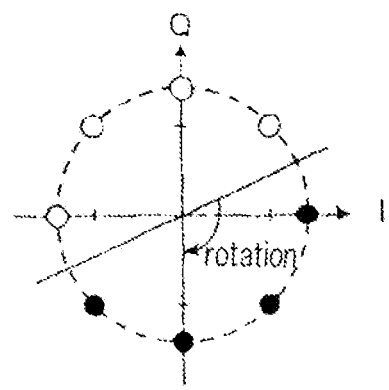
FIG. 11A is a schematic view showing the change of a constellation before and after rotational correction relating to bit b0 in FSK modulation.
Figure 11A:
Figure 11A:
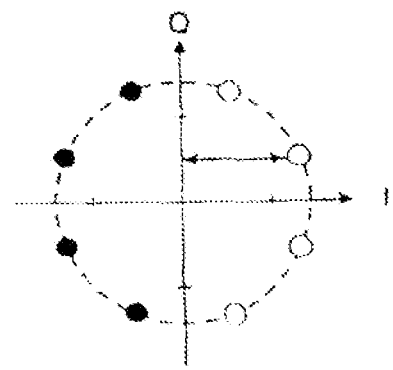
Figure 11B:
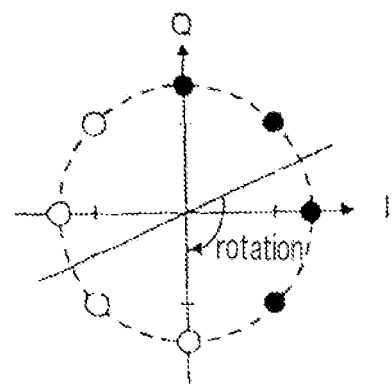
FIG. 11B is a schematic view showing the change of a constellation before and after rotational correction relating to bit b1 in FSK modulation.
Figure 11B:
Figure 11B:
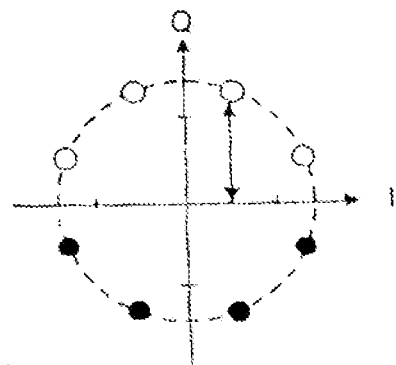
Figure 11C:
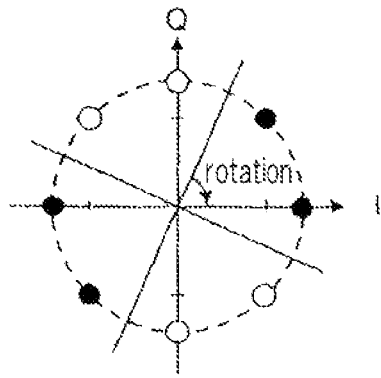
FIG. 11C is a schematic view showing the change of a constellation before and after rotational correction relating to bit b2 in FSK modulation.
Figure 11C:
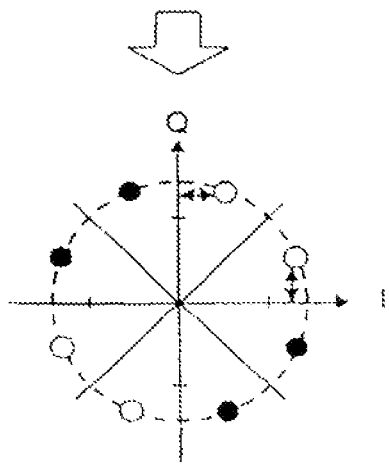

FIGS. 11A-11C show examples of likelihood value calculation methods of each bit of 8 PSK modulation when bit assignment is carried out as shown in FIG. 10. In FIGS. 11A-11C, white dots show signal points for which the bit value is "0" and black dots show signal points for which the bit value is "1."

FIG. 11A is an example of a constellation for bit b0. The upper drawing (a1) is the state of the constellation before rotation, and the lower drawing (a2) is the state of the constellation following rotation. When rotated exactly 112.5° in the clockwise direction from the state of the upper drawing (a1), white dots are positioned in the first quadrant and fourth quadrant and black dots are positioned in the second quadrant and third quadrant as in the lower drawing (a2). In this case, the I-axis component of the equalization signal after rotational correction is the likelihood value when bit b0 is "0."

Similarly, FIG. 11B is an example of a constellation for bit b1. The upper drawing (b1) is the state of the constellation before rotation, and the lower drawing (b2) is the state of the constellation after rotation. When rotated exactly 112.5° in a clockwise direction from the state of the upper drawing (b1), white dots are positioned in the first quadrant and second quadrant and black dots are positioned in the third quadrant and fourth quadrant as shown in the lower drawing (b2). In this case, the Q-axis component of the equalization signal after rotational correction is the likelihood values when bit b1 is "0."

FIG. 11C is an example of a constellation for bit b2. The upper drawing (c1) is the state of the constellation before rotation, and the lower drawing (c2) is the state of the constellation after rotation. When rotated exactly 67.5° in a clockwise direction from the state of the upper drawing (c1), white dots are positioned in the first quadrant and third quadrant and black dots are positioned in the second quadrant and fourth quadrant as shown in the lower drawing (c2). In this case, when the I-axis component and Q-axis component of the equalization signal following rotational correction are compared, when the I-axis component is equal to or greater than the Q-axis component and the sum of the I-axis component and Q-axis component is equal to or greater than "0," the likelihood value when bit b2 is "0" is the value of the Q-axis component. When the I-axis component is less than the Q-axis component and the sum of the I-axis component and the Q-axis component is equal to or greater than "0," the likelihood value when bit b2 is "0" is the value of the I-axis component. When the I-axis component is equal to or greater than the Q-axis component and the sum of the I-axis component and the Q-axis component is less than "0," the likelihood value when bit b2 is "0" is the value of the arithmetic inversion of the value of the T-axis component. When the I-axis component is less than the Q-axis component and the sum of the I-axis component and the Q-axis component is less than "0," the likelihood value when bit b2 is "0" is the value of the arithmetic inversion of the value of the Q-axis component.

In other words, in the likelihood value calculation for 8 PSK modulation, the likelihood value calculation of bits b0 and b1 is a subset of the QPSK likelihood value calculation, but the likelihood value calculation of bit b2 requires preparation of a special likelihood value calculation.

Figure 12A:
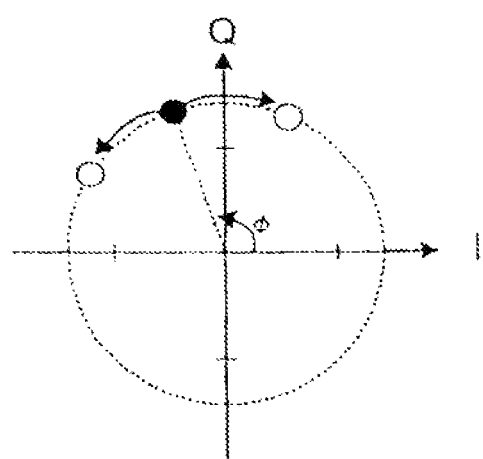
FIG. 12A shows an example of change over time of a constellation of an equalization signal before rotational correction in FSK modulation.
Figure 12B:
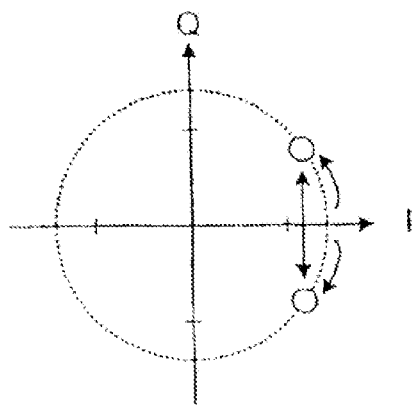
FIG. 12B shows an example of change over time of a constellation of an equalization' signal after rotational correction in FSK modulation.

FIG. 12A and FIG. 12B show the change of signal points of a constellation of FSK modulation. FIG. 12A is an example of the change of signal points of the constellation before rotation, and FIG. 12B is an example of the change of signal points of a constellation after rotation.

In the case of FSK modulation, bit assignment is implemented to two states: a state in which the frequency is higher than the center frequency, and a state in which the frequency is lower than the center frequency.

For example, signal points of a constellation rotate in the counterclockwise direction when the frequency is higher than the center frequency, and signal points of a constellation rotate in the clockwise direction when the frequency is lower than the center frequency. Bit 0 is assigned to signal points when the frequency is higher than the center frequency, and bit 1 is assigned to signal points when the frequency is lower than the center frequency. In this type of bit assignment, when the next equalization signal is subjected to rotational correction to the extent of the phase angle of the immediately preceding equalization signal as in the equalization process in DQPSK modulation, a signal point of the constellation goes back and forth above and below the I-axis as shown in FIG. 12B, the Q-axis component being positive for bit 0 and the Q-axis component being negative for bit 1.

Figure 13:
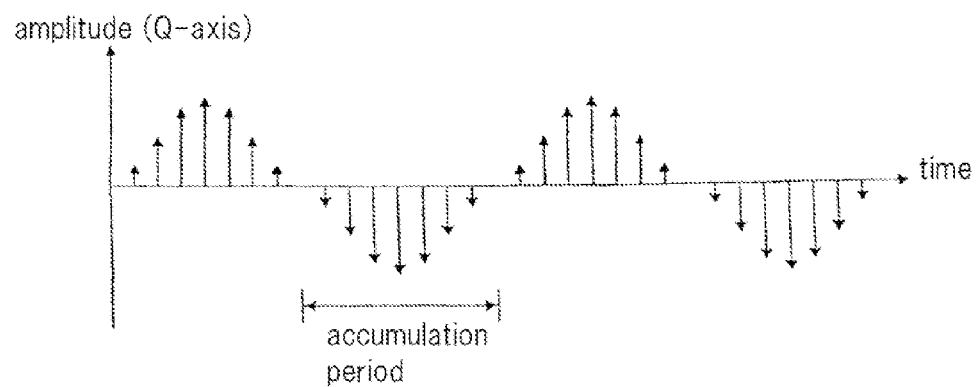
FIG. 13 shows the change of a Q-axis component after rotational correction in FSK modulation.

FIG. 13 shows the change of the Q-axis component after rotational correction in FSK modulation. In FIG. 13, the vertical axis shows amplitude (Q-axis) and the horizontal axis shows time. In the case of FSK modulation, changes of frequency with respect to the sampling frequency are comparatively gentle, and the Q-axis component after rotational correction therefore changes gradually at a fixed period as shown in FIG. 13. Accordingly, in the case of FSK modulation, likelihood of a signal point can be found by accumulating the Q-axis component in the time interval of this cycle.

A likelihood value calculation circuit can be realized that can deal with the modulation modes of a variety of radio systems by appropriately combining the method of rotating an equalization signal, a method of calculating likelihood values and inverting the likelihood value that were calculated for each bit position, and a method of accumulating the likelihood values as described hereinabove. By sharing circuits, this likelihood value calculation circuit further enables a reduction of installation space of the likelihood value calculation circuit and a decrease in the cost of the likelihood value calculation circuit.

The likelihood value calculation device of the present invention is next described in detail.

Figure 1:
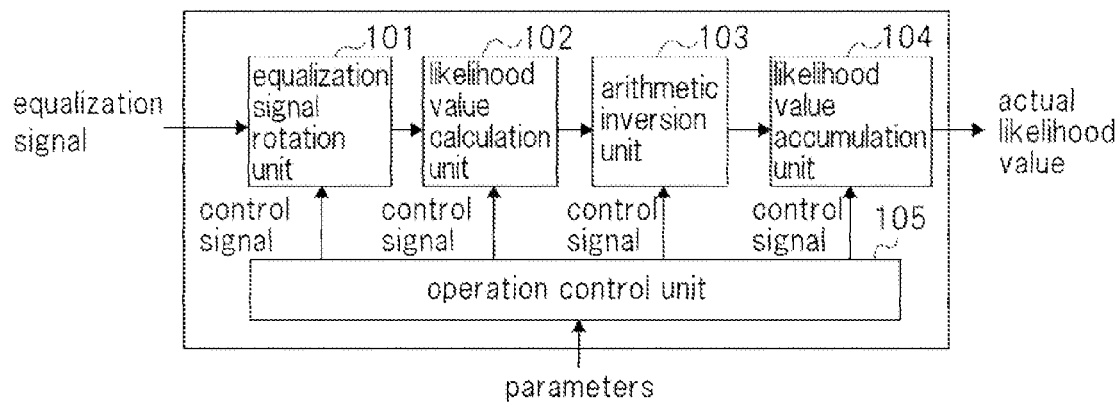
FIG. 1 is a block diagram that shows the configuration of the likelihood value calculation device that is the first exemplary embodiment of the present invention.

FIG. 1 is a block diagram showing the configuration of the likelihood value calculation device that is an exemplary embodiment of the present invention. This likelihood value calculation device includes equalization signal rotation unit 101, likelihood value calculation unit 102, arithmetic inversion unit 103, likelihood value accumulation unit 104, and operation control unit 105.

Equalization signal rotation unit 101 subjects an equalization signal that is received as input to rotational correction in accordance with a control signal that includes parameters. Likelihood value calculation unit 102 takes the output signal of equalization signal rotation unit 101 as input and calculates a provisional likelihood value for a particular representative pattern. The provisional likelihood value is supplied from likelihood value calculation unit 102 to arithmetic inversion unit 103.

Arithmetic inversion unit 103 is configured to allow setting of inversion positions in accordance with a control signal that includes parameters and subjects a likelihood value that has been calculated in likelihood value calculation unit 102 to an arithmetic inversion process based on the inversion positions of a constellation that is set by parameters. Likelihood value accumulation unit 104 accumulates likelihood values that have undergone the inversion process from likelihood value calculation unit 102.

Operation control unit 105 controls the operations of each of equalization signal rotation unit 101, likelihood value calculation unit 102, arithmetic inversion unit 103, and likelihood value accumulation unit 104.

When the combination of radio mode and modulation mode in use is switched to another combination of radio mode and modulation mode, a processor that is incorporated in the baseband LSI sets control information that includes parameters that correspond to the combination that follows switching to the likelihood value calculation device of the present exemplary embodiment. The parameters include information such as the combination of radio mode and modulation mode in use, the pattern of a constellation in the combination, and the FSK accumulation period.

In the likelihood value calculation device of the present exemplary embodiment, equalization signal rotation unit 101 first subjects the equalization signal that was received as input to rotational correction in accordance with a control signal that includes parameters. Likelihood value calculation unit 102 next finds a provisional likelihood value based on the output signal of equalization signal rotation unit 101.

Arithmetic inversion unit 103 next subjects the provisional likelihood value that was calculated in likelihood value calculation unit 102 for each bit position to an arithmetic inversion process based on the parameters that were given. Finally, likelihood value accumulation unit 104 carries out an accumulation process of the likelihood values that are supplied from arithmetic inversion unit 103 and obtains the actual likelihood value from the result.

In the above-described procedure, likelihood value calculation unit 102 generates one likelihood value at a time and uses a plurality of cycles to find a plurality of likelihood values that are obtained from a single equalization signal.

The actual operations of the likelihood value calculation device of the present exemplary embodiment are next described for each modulation mode.

Modulation such as 64 QAM, 16 QAM, and QPSK

The equalization signal that is received as input passes through equalization signal rotation unit 101 without alteration and is applied to likelihood value calculation unit 102.

In accordance with a control signal from operation control unit 105, likelihood value calculation unit 102 supplies as output one of the plurality of provisional likelihood values that are generated from the equalization signal that was received. In the case of 16 QAM modulation, for example, likelihood value calculation unit 102 generates four provisional likelihood values from one equalization signal and supplies one of these four provisional likelihood values according to the control signal.

In accordance with a control signal from operation control unit 105, arithmetic inversion unit 103 either subjects the one likelihood value that was supplied from likelihood value calculation unit 102 to arithmetic inversion and then supplies the result as output or supplies the likelihood value without alteration. The likelihood value that is supplied from arithmetic inversion unit 103 passes by way of likelihood value accumulation unit 104 and is supplied as the actual likelihood value.

In the above-described operations, operation control unit 105 generates control signals in accordance with a pattern that was designated by parameters. In accordance with these control signals, the single likelihood value that was generated by likelihood value calculation unit 102 is applied as input to arithmetic inversion unit 103, in arithmetic inversion unit 103 the likelihood value that was received as input is either subjected to arithmetic inversion and supplied as output or supplied as output without alteration, and this output likelihood value is supplied from likelihood value accumulation unit 104 as one actual likelihood value. By repeating this process, a plurality of actual likelihood values are supplied as output from likelihood value accumulation unit 104.

The order of supplying of each of the control signals to equalization signal rotation unit 101, likelihood value calculation unit 102, arithmetic inversion unit 103, and likelihood value accumulation unit 104 that are generated in operation control unit 105 can be switched according to parameters.

Modulation such as BPSK

The equalization signal that is received as input is subjected to rotational correction by using equalization signal rotation unit 101 in accordance with parameters that were designated according to necessity, and likelihood values are found by likelihood value calculation unit 102.

Arithmetic inversion unit 103 either subjects the likelihood values from likelihood value calculation unit 102 to arithmetic inversion and then supplies the result or supplies the likelihood values as output without alteration according to a control signal from operation control unit 105. The likelihood values that are supplied from arithmetic inversion unit 103 pass by way of likelihood value accumulation unit 104 and are supplied as actual likelihood values.

In modulation such as DQPSK, the equalization signal that is received as input is subjected to rotational correction according to the phase angle of the preceding equalization signal using equalization signal rotation unit 101, following which likelihood value calculation unit 102 is used to calculate an actual likelihood value similar to the likelihood value calculation method of modulation such as QPSK that was described hereinabove.

In 8 PSK modulation, the equalization signal that is received as input is subjected to rotational correction using equalization signal rotation unit 101 in accordance with parameters that were designated, and likelihood values are found by likelihood value calculation unit 102. Next, arithmetic inversion unit 103 either subjects the above-described likelihood values to arithmetic inversion in accordance with a control signal or supplies the likelihood value without alteration. The result then passes through likelihood value accumulation unit 104 to be supplied as the actual likelihood value. However, in the calculation of the likelihood value of bit b2 of 8 PSK modulation, a special likelihood value calculation process is carried out.

FSK Modulation

Equalization signal rotation unit 101 subjects an equalization signal that is received as input to rotational correction that accords with the phase angle of the preceding equalization signal. Likelihood value calculation unit 102 next finds likelihood values from the signal that has undergone rotational correction by equalization signal rotation unit 101.

Arithmetic inversion unit 103 next either subjects the likelihood value that was supplied from likelihood value calculation unit 102 to arithmetic inversion according to a control signal from operation control unit 105 and supplies the result or supplies the likelihood value without alteration. The likelihood value that is supplied from arithmetic inversion unit 103 is applied as input to likelihood value accumulation unit 104. Likelihood value accumulation unit 104 accumulates the likelihood values of a fixed period and supplies the result as the actual likelihood value.

Working Example 1

The configurations of each of equalization signal rotation unit 101, likelihood value calculation unit 102, arithmetic inversion unit 103, and likelihood value accumulation unit 104 that are used as parts of the likelihood value calculation device of FIG. 1 are next described as an actual working example.

The actual configuration of likelihood value calculation unit 102 is first described.

Figure 14:
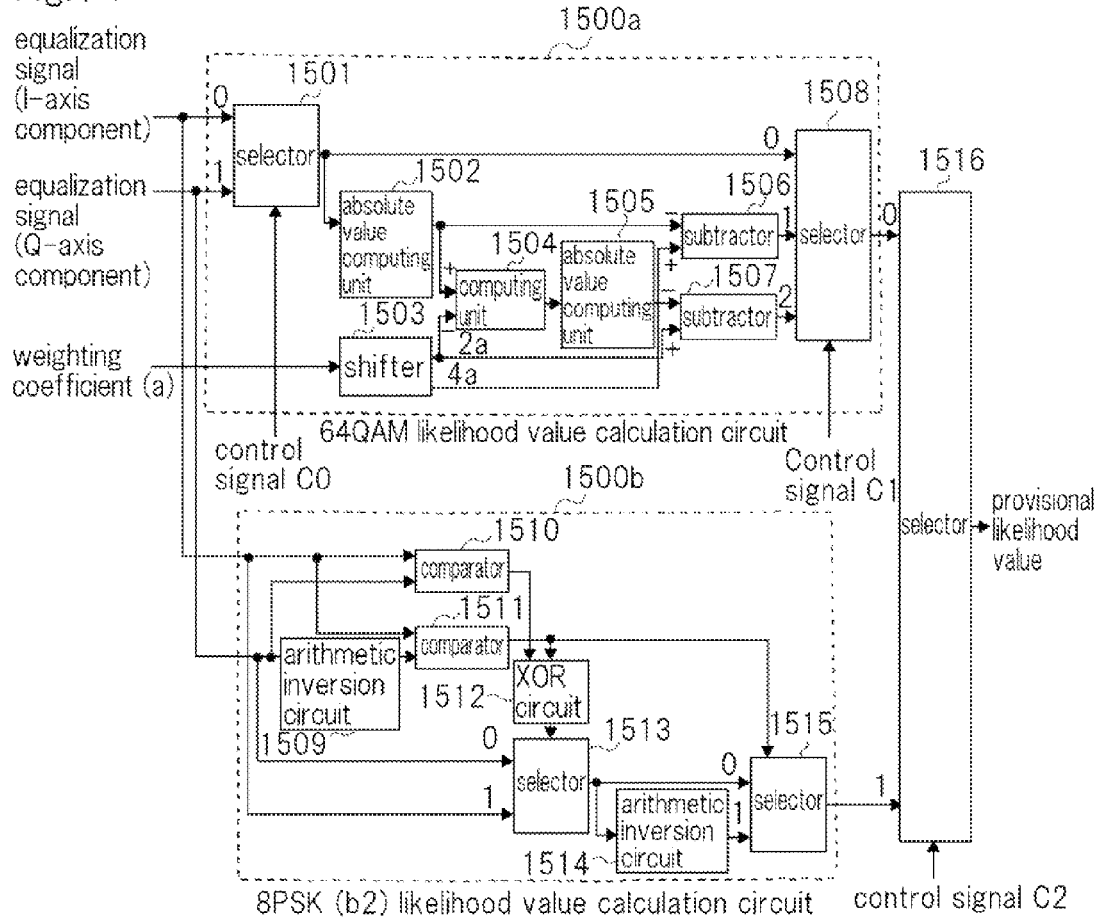
FIG. 14 is a block diagram showing the configuration of the likelihood value calculation unit of the likelihood value calculation device shown in FIG. 1.

FIG. 14 shows an example of the configuration of the likelihood value calculation unit. This likelihood value calculation unit includes 64 QAM likelihood value calculation circuit 1500a, 8 PSK (b2) likelihood value calculation circuit 1500b, and selector 1516 that selects one of the output signals of these components. 8 PSK (b2) likelihood value calculation circuit 1500b is used when the likelihood value of bit b2 of 8 PSK modulation is to be found, and 64 QAM likelihood value calculation circuit 1500a is used when other likelihood values are to be found.

As shown in FIG. 14, 64 QAM likelihood value calculation circuit 1500a includes: selector 1501, absolute value computing unit 1502, shifter 1503, subtractor 1504, absolute value computing unit 1505, subtractor 1506, subtractor 1507, and selector 1508.

Selector 1501 includes first input terminal ("0"-side), to which the I-axis component of the equalization signal is supplied, and second input terminal ("1" side), to which the Q-axis component of the equalization signal is supplied, and selects either of the components of the equalization signal (I-axis component and Q-axis component) that is supplied to the first and second input terminals in accordance with control signal C0 from operation control unit 105. The output of selector 1501 is supplied to absolute value computing unit 1502 and the first input terminal ("0" side) of selector 1508.

Absolute value computing unit 1502 finds the absolute value of the output value of selector 1501. The output value (absolute value) of absolute value computing unit 1502 is both supplied to the plus-side input terminal of subtractor 1504 and the minus-side input terminal of subtractor 1506.

Weighting coefficient a is supplied to shifter 1503. Shifter 1503 finds value 2a obtained by multiplying weighting coefficient a that is received as input by 2 and value 4a obtained by multiplying weighting coefficient a by 4. The first output value (2a) of shifter 1503 is both supplied to the minus-side input terminal of subtractor 1504 and supplied to the plus-side input terminal of subtractor 1507.

Subtractor 1504 subtracts the first output value (2a) of shifter 1503 from the output value of absolute value computing unit 1502. The output value of subtractor 1504 is supplied to absolute value computing unit 1505. Absolute value computing unit 1505 finds the absolute value of the output value of subtractor 1504. The output value (absolute value) of absolute value computing unit 1505 is supplied to the minus-side input terminal of subtractor 1507.

Subtractor 1506 subtracts the output value of absolute value computing unit 1502 from the second output value (4a) of shifter 1503. The output of subtractor 1506 is supplied to the second input terminal ("1"-side) of selector 1508.

Subtractor 1507 subtracts the output value of absolute value computing unit 1505 from the first output value (2a) of shifter 1503. The output of subtractor 1507 is supplied to the third input terminal ("2"-side) of selector 1508.

In accordance with control signal C1 from operation control unit 105, selector 1508 selects one of the output values from among the output value of selector 1501 that was supplied to the first input terminal, the output value of subtractor 1506 that was supplied to the second input terminal, and the output value of subtractor 1507 that was supplied to the third input terminal. The output of selector 1508 is supplied to the first input terminal of selector 1516.

64 QAM likelihood value calculation circuit 1500a that was described hereinabove is provided with an arithmetic capability that finds the relation of likelihood values and the amplitude of the equalization signal shown in FIGS. 6A-6C. For example, control signal C0 is a signal for selecting whether to use the I-axis component or the Q-axis component as amplitude r.

Control signal C1 is a signal indicating which type to select among the three types shown in FIGS. 11A-11C.

For example, "0" is given as control signal C1 when the type of FIG. 11A is to be selected. In this way, the output value of selector 1501 is selected in selector 1508. When the type of FIG. 11B is to be selected, "1" is given as control signal C1, whereby the output value of subtractor 1506 is selected in selector 1508. When the type of FIG. 11C is to be selected, "2" is given as control signal C1, whereby the output value of subtractor 1507 is selected in selector 1508.

In cases other than finding the likelihood value of b2 of 8 PSK modulation, likelihood value calculation is carried by one of the above-described three types. In other words, 64 QAM likelihood value calculation circuit 1500a is used in almost all cases of calculating likelihood values other than when finding the likelihood value of b2 of 8 PSK modulation.

The configuration of 8 PSK (b2) likelihood value calculation circuit 1500b is next described.

8 PSK (b2) likelihood value calculation circuit 1500b includes: arithmetic inversion circuit 1509, comparator 1510, comparator 1511, XOR circuit 1512, selector 1513, arithmetic inversion circuit 1514, and selector 1515.

Arithmetic inversion circuit 1509 carries out a process of arithmetic inversion of the Q-axis component of the equalization signal that is received as input. The output of arithmetic inversion circuit 1509 is supplied to one of the inputs of comparator 1511.

Comparator 1510 compares the I-axis component and the Q-axis component of the equalization signal. The output of comparator 1510 is supplied to XOR circuit 1512.

Comparator 1511 compares the I-axis component of the equalization signal that was received as input with the output value (a value obtained by subjecting the Q-axis component to arithmetic inversion) of arithmetic inversion circuit 1509. The output of comparator 1511 (the result of comparison) is supplied to XOR circuit 1512 and selector 1515.

XOR circuit 1512 carries out an operation to obtain the XOR of the comparison result of comparator 1510 and the comparison result of comparator 1511. The output of XOR circuit 1512 is supplied to selector 1513.

Selector 1513 includes a first input terminal ("0"-side) to which the I-axis component of the equalization signal is supplied and a second input terminal ("1"-side) to which the Q-axis component of the equalization signal is supplied. Selector 1513 selects either the I-axis component that is supplied to the first input terminal or the Q-axis component that is supplied to the second input terminal in accordance with the output (XOR operation result) of XOR circuit 1512. The output of selector 1513 is supplied to arithmetic inversion circuit 1514 and the first input terminal ("0" side) of selector 1515.

Arithmetic inversion circuit 1514 subjects the output value of selector 1513 to an arithmetic inversion process. The output of arithmetic inversion circuit 1514 is supplied to the second input terminal ("1" side) of selector 1515.

In accordance with the value of control signal C2 from operation control unit 105, selector 1516 selects either the output of selector 1508 of 64QAM likelihood value calculation circuit 1500a or the output of selector 1515 of 8PSK (b2) likelihood value calculation circuit 1500b. The output value of selector 1516 is supplied as provisional likelihood value to arithmetic inversion unit 103 shown in FIG. 1.

The actual configuration of equalization signal rotation unit 101 is next described.

Figure 15:
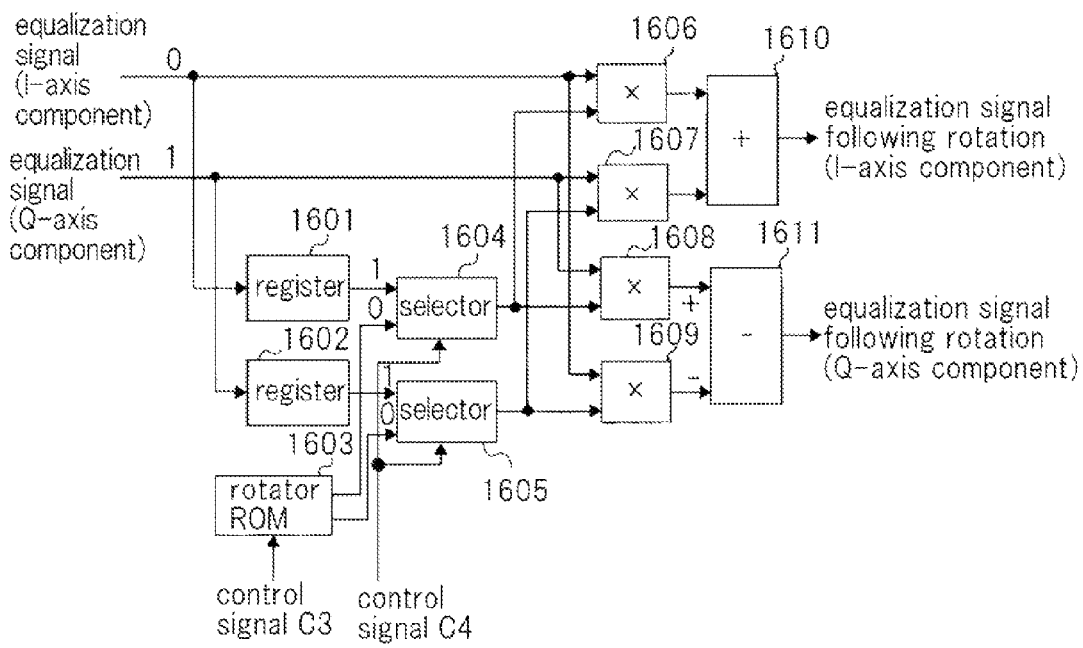
FIG. 15 is a block diagram showing the configuration of the equalization signal rotation unit of the likelihood value calculation device shown in FIG. 1.

FIG. 15 shows an example of the configuration of the equalization signal rotation unit. This equalization signal rotation unit includes: registers 1601 and 1602, rotator ROM 1603, selectors 1604 and 1605, multipliers 1606-1609, adder 1610, and subtractor 1611.

Register 1601 holds the I-axis component of the preceding equalization signal, and register 1602 holds the Q-axis component of the preceding equalization signal. The output of register 1601 is supplied to the first input terminal ("1"-side) of selector 1604. The output of register 1602 is supplied to the first input terminal ("1"-side) of selector 1605.

In accordance with the value of control signal C3 from operation control unit 105, rotator ROM (Read Only Memory) 1603 supplies the I-axis component or Q-axis component for rotational correction. The output of Rotator ROM 1603 is supplied to the second input terminal ("0"-side) of each of selectors 1604 and 1605.

In accordance with the value of control signal C4 from operation control unit 105, selector 1604 selects either the output value of register 1601 that was applied as input to the first input terminal or the output value of rotator ROM 1603 that was applied as input to the second input terminal. The output of selector 1604 is supplied to one of the input terminals of each of multipliers 1606 and 1608.

In accordance with the value of control signal C4 from operation control unit 105, selector 1605 selects either the output value of register 1602 that was applied as input to the first input terminal or the output value of rotator ROM 1603 that was applied as input to the second input terminal. The output of selector 1605 is supplied to one input terminal of each of multipliers 1607 and 1609.

The I-axis component of the equalization signal that was received as input is supplied to the other input terminal of multiplier 1606. Multiplier 1606 multiplies the output value of selector 1604 that was supplied to one input terminal and the value of the I-axis component that was supplied to the other input terminal. The output of multiplier 1606 is supplied to one input terminal of adder 1610.

The Q-axis component of the equalization signal that was received as input is supplied to the other input terminal of multiplier 1607. Multiplier 1607 multiplies the output value of selector 1605 that was supplied to one input terminal and the value of the Q-axis component that was supplied to the other input terminal. The output of multiplier 1607 is supplied to the other input terminal of adder 1610.

The Q-axis component of the equalization signal that was received as input is supplied to the other input terminal of multiplier 1608. Multiplier 1608 multiplies the output value of selector 1604 that was supplied to one input terminal and the value of the Q-axis component that was supplied to the other input terminal. The output of multiplier 1608 is supplied to one input terminal of subtractor 1611.

The I-axis component of the equalization signal that was received as input is supplied to the other input of multiplier 1609. Multiplier 1609 multiplies the output value of selector 1605 that was supplied to one input terminal and the value of the I-axis component that was supplied to the other input terminal. The output of multiplier 1609 is supplied to the other input terminal of subtractor 1611.

Adder 1610 adds the output value of multiplier 1606 that was supplied to one input terminal and the output value of multiplier 1607 that was supplied to the other input terminal and supplies the result of addition as the I-axis component of the equalization signal following rotation.

Subtractor 1611 subtracts the output value of multiplier 1609 that was supplied to one input terminal from the output value of multiplier 1608 that was supplied to the other input terminal and supplies the result of subtraction as the Q-axis component of the equalization signal after rotation.

When control signal C4 is "0" in the above-described equalization signal rotation unit 101, the equalization signal is subjected to rotational correction in the clockwise direction by exactly the phase angle designated by control signal C3, and when control signal C4 is "1," the equalization signal is subjected to rotational correction in the clockwise direction by exactly the phase angle of the preceding equalization signal that was stored in registers 1601 and 1602.

The actual configuration of arithmetic inversion unit 103 is next described.

Figure 16:
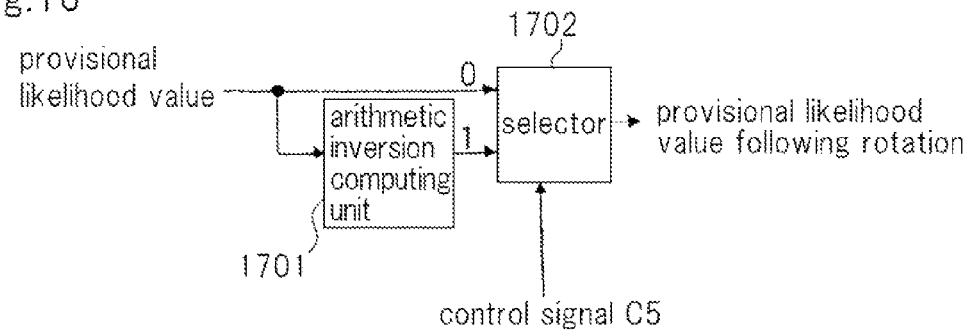
FIG. 16 is a block diagram showing the configuration of the arithmetic inversion unit of the likelihood value calculation device shown in FIG. 1.

FIG. 16 shows the configuration of the arithmetic inversion unit. The arithmetic inversion unit includes arithmetic inversion computing unit 1701 and selector 1702. The output (provisional likelihood value) of selector 1516 of the likelihood value calculation unit shown in FIG. 14 is supplied to arithmetic inversion computing unit 1701 and the first input terminal ("0"-side) of selector 1702.

Arithmetic inversion computing unit 1701 subjects the provisional likelihood value that was received as input to an arithmetic inversion process. The output of arithmetic inversion computing unit 1701 (a value obtained by arithmetic inversion of the provisional likelihood value) is supplied to the second input terminal ("1"-side) of selector 1702.

In accordance with the value of control signal C5 from operation control unit 105, selector 1702 selects either the provisional likelihood value that was supplied to the first input terminal or the output value of arithmetic inversion computing unit 1701 that was supplied to the second input terminal and supplies the selected value as the provisional likelihood value after inversion.

The above-described arithmetic inversion unit receives as input the likelihood value that was supplied from the likelihood value calculation unit shown in FIG. 14. When control signal C5 is "0," the arithmetic inversion unit supplies the likelihood value that was received as input from the likelihood value calculation unit without alteration. When control signal C5 is "1," the arithmetic inversion unit supplies a value obtained by subjecting the likelihood value that was received as input from the likelihood value calculation unit to arithmetic inversion:

The actual configuration of likelihood value accumulation unit 104 is next described.

Figure 17:
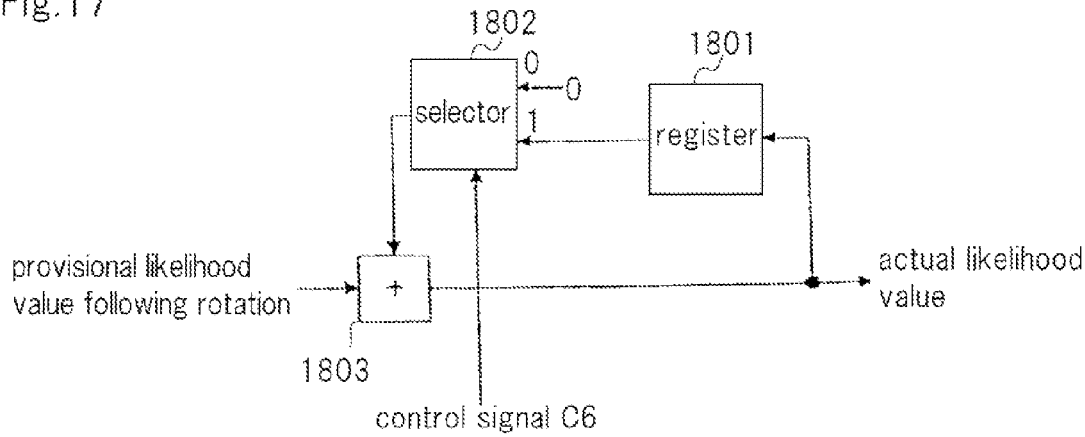
FIG. 17 is a block diagram showing the configuration of the likelihood value accumulation unit of the likelihood value calculation device shown in FIG. 1.

FIG. 17 shows an example of the configuration of the likelihood value accumulation unit. The likelihood value accumulation unit includes register 1801, selector 1802 and adder 1803.

Register 1801 stores the output value of adder 1803. The output of register 1801 is supplied to the first input terminal ("1"-side) of selector 1802.

A value that indicates "0" is supplied to the second input terminal ("0"-side) of selector 1802. In accordance with the value of control signal C6 from operation control unit 105, selector 1802 selects one of the output values of register 1801 that is supplied to the first input terminal and the value (=0) that is supplied to the second input terminal. The output of selector 1802 is supplied to one of the input terminals of adder 1803.

The provisional likelihood value that follows inversion and that is supplied from the arithmetic inversion unit shown in FIG. 16 is supplied to the other input terminal of adder 1803. Adder 1803 adds the output value of register 1801 that was supplied to one input terminal and the provisional likelihood value that follows inversion that was supplied to the other input terminal and supplies the result of this addition as the actual likelihood value. This actual likelihood value that is supplied from adder 1803 is stored in register 1801 as the preceding output value in the next addition process.

The above-described likelihood value accumulation unit supplies the provisional likelihood value that follows inversion that was received as input when control signal C6 is "0." When control signal C6 is "1," the likelihood value accumulation unit adds the value supplied by adder 1803 in the preceding addition process and the provisional likelihood value that follows inversion that was received as input in this addition process. The likelihood values are thus accumulated.

An example of the timing of control signals during calculation of likelihood values is described for each modulation mode in the likelihood value calculation device of the present working example that is provided with equalization signal rotation unit 101, likelihood value calculation unit 102, arithmetic inversion unit 103, and likelihood value accumulation unit 104 shown in FIGS. 14-17.

Figure 18:
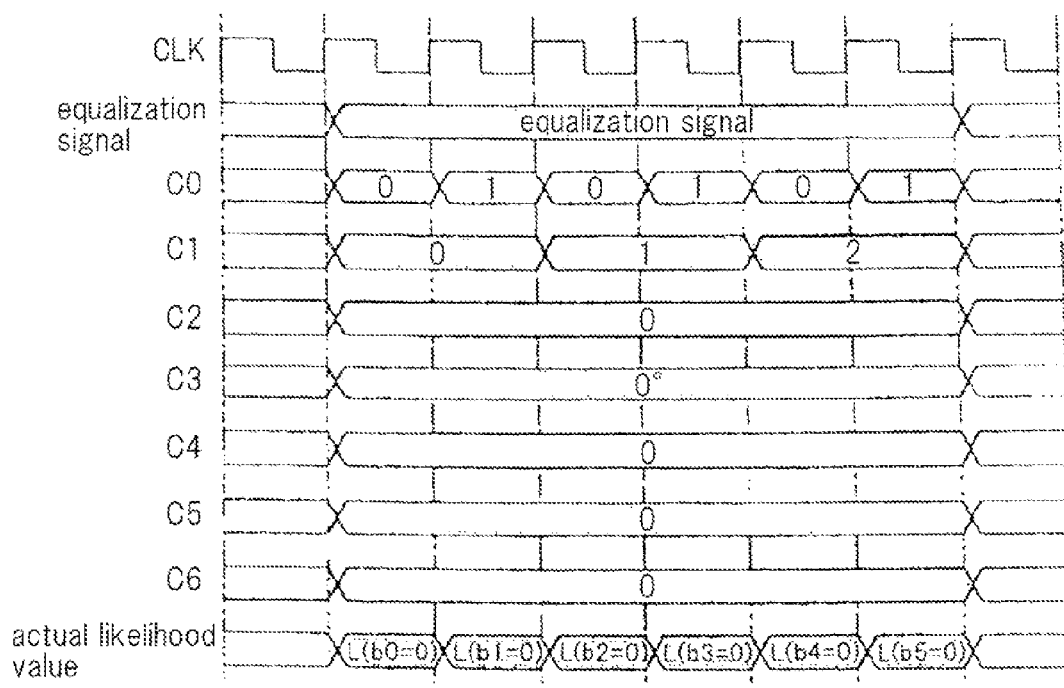
FIG. 18 is a timing chart for describing the likelihood value calculation operation when 64QAM modulation is used in an LTE system.

FIG. 18 shows an example of the likelihood value calculation timing when the likelihood value calculation device of the present Working Example is applied in an LTE system of 64 QAM modulation.

When "0" is assigned to control signal C0 and "0" is assigned to control signal C1, likelihood value L (b0=0) when bit b0 is "0" is supplied as output. When "1" is assigned to control signal C0 and "0" is assigned to control signal C1, likelihood value L (b1=0) when bit b1 is "0" is supplied as output. When "0" is assigned to control signal C0 and "1" is assigned to control signal C1, likelihood value L (b2=0) when bit b2 is "0" is supplied as output.

When "1" is assigned to control signal C0 and "1" is assigned to control signal C1, likelihood value L (b3=0) when bit b3 is "0" is supplied as output. When "0" is assigned to control signal C0 and "2" is assigned to control signal C1, likelihood value L (b4=0) when bit b0 is "4" is supplied as output. When "1" is assigned to control signal C0 and "2" is assigned to control signal C1, likelihood value L (b5=0) when bit b5 is "0" is supplied as output.

Figure 19:
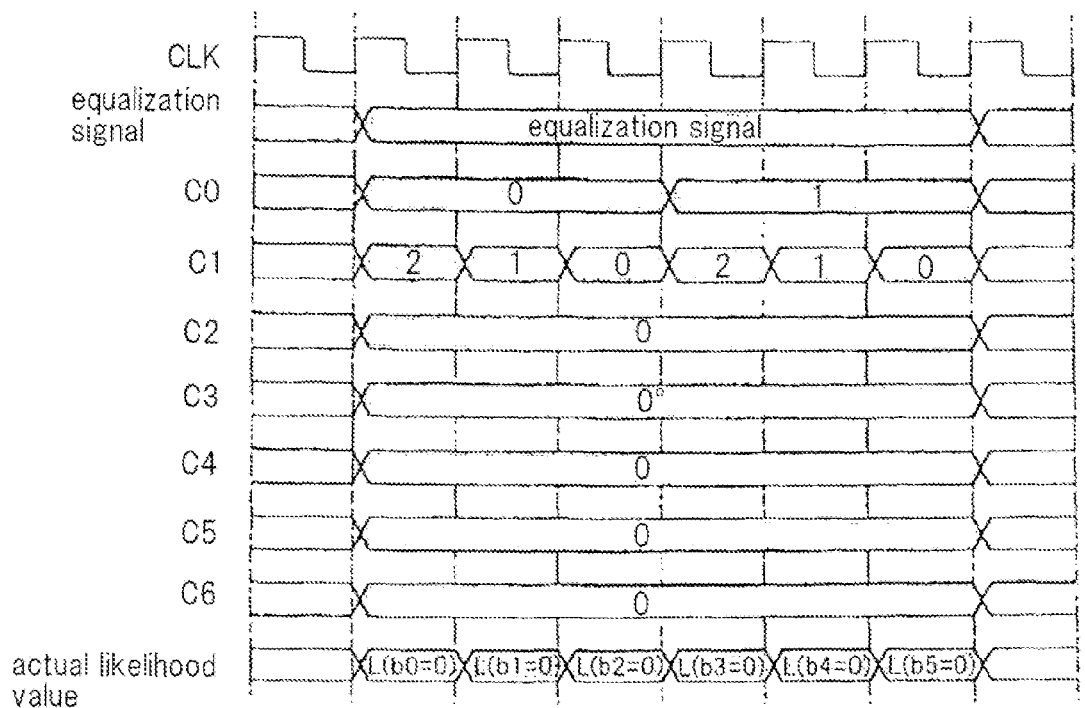
FIG. 19 is a timing chart showing an example of the likelihood value calculation operation when 64QAM modulation is used in a WiMAX system.

FIG. 19 shows an example of the likelihood value calculation timing when the likelihood value calculation device of the present Working Example is applied to a WiMAX system of 64 QAM modulation.

When "0" is assigned to control signal C0 and "2" is assigned to control signal C1, likelihood value L (b0=0) when bit b0 is "0" is supplied as output. When "0" is assigned to control signal C0 and "1" is assigned to control signal C1, likelihood value L (b1=0) when bit b1 is "0" is supplied as output. When "0" is assigned to control signal C0 and "0" is assigned to control signal C1, likelihood value L (b2=0) when bit b2 is "0" is supplied as output.

When "1" is assigned to control signal C0 and "2" is assigned to control signal C1, likelihood value L (b3=0) when bit b3 is "0" is supplied as output. When "1" is assigned to control signal C0 and "1" is assigned to control signal C1, likelihood value L (b4=0) when bit b4 is "0" is supplied as output. When "1" is assigned to control signal C0 and "0" is assigned to control signal C1, likelihood value L (b5=0) when bit b5 is "0" is supplied as output.

Figure 20:
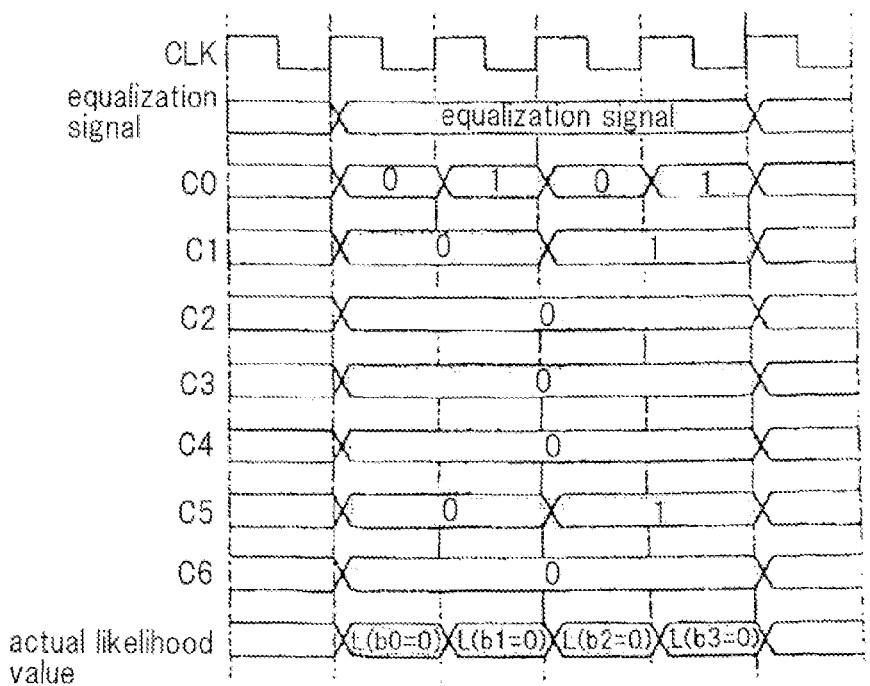
FIG. 20 is a timing chart showing the likelihood value calculation operation when 16QAM modulation is used in an ISDB-T system.

FIG. 20 shows an example of the likelihood value calculation timing when the likelihood value calculation device of the present working example is applied in an ISDB-T system of 16 QAM modulation.

When "0" is assigned to control signal C0, "0" is assigned to control signal C1, and "0" is assigned to control signal C5, likelihood value L (b0=0) when bit b0 is "0" is supplied as output. When "1" is assigned to control signal C0, "0" is assigned to control signal C1, and "0" is assigned to control signal C5, likelihood value L (b1=0) when bit b1 is "0" is supplied as output.

When "0" is assigned to control signal C0, "1" is assigned to control signal C1, and "1" is assigned to control signal C5, likelihood value L (b2=0) when bit b2 is "0" is supplied as output. When "1" is assigned to control signal C0, "1" is assigned to control signal C1, and "1" is assigned to control signal C5, likelihood value L (b3=0) when bit b3 is "0" is supplied as output.

However, when the likelihood value of 16 QAM is to be calculated, a value must be assigned as weighting coefficient a that is one-half the absolute value of the I-axis component (or the Q-axis component) of the signal point of the constellation that is closest to the origin.

Figure 21:
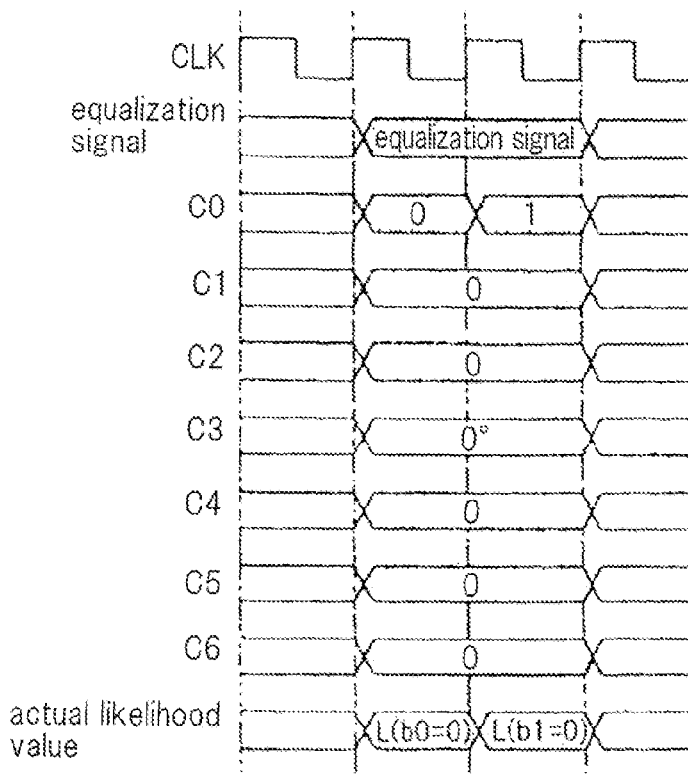
FIG. 21 is a timing chart showing the likelihood value calculation operation when QPSK modulation is used in an LTE system.

FIG. 21 shows an example of the likelihood value calculation timing when the likelihood value calculation device of the present working example is applied in an LTE system of QPSK modulation.

When "0" is assigned to control signal C0, likelihood value L (b0=0) when bit b0 is "0" is supplied as output. When "1" is assigned to control signal C0, likelihood value L (b1=0) when bit b1 is "0" is supplied as output.

Figure 22:
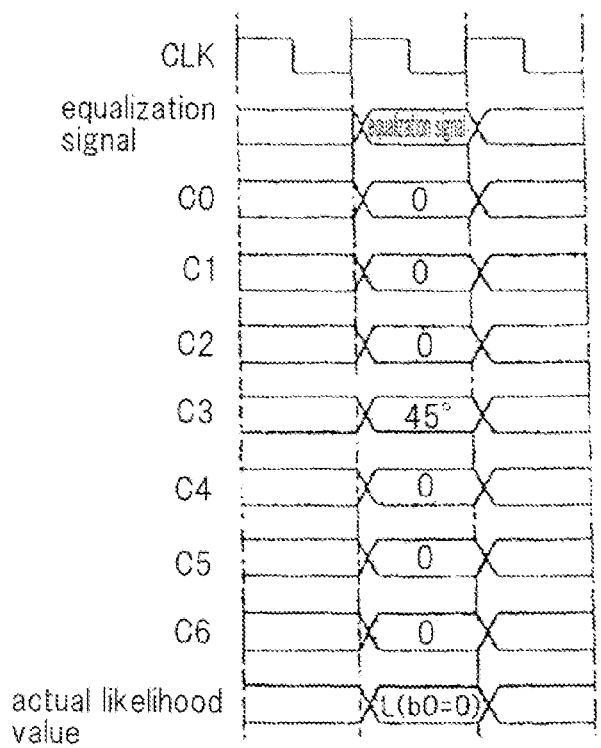
FIG. 22 is a timing chart showing the likelihood value calculation operation when BPSK modulation is used in an LTE system.

FIG. 22 shows an example of the likelihood value calculation timing when the likelihood value calculation device of the present working example is applied in an LTE system of BPSK modulation.

Likelihood value L (b0=0) when bit b0 is "0" is supplied as output by assigning "0" to control signal C0 and by assigning a parameter to control signal C3 for implementing rotational correction of 45° in the clockwise direction.

Figure 23:
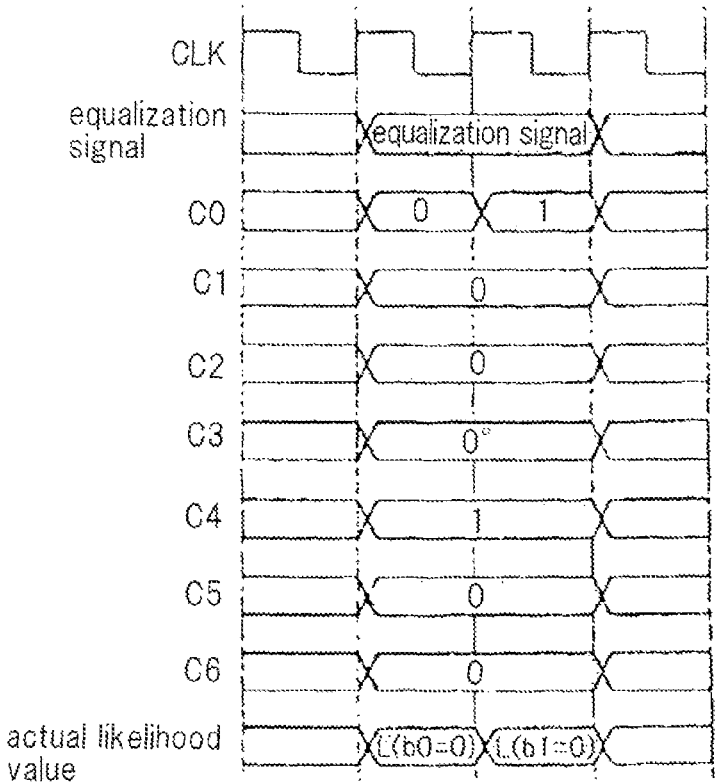
FIG. 23 is a timing chart showing the likelihood value calculation operation in DQPSK modulation.

FIG. 23 shows an example of the likelihood value calculation timing in DQPSK modulation in which bit assignment such as shown in FIG. 9 is implemented.

By assigning "1" to control signal C4, rotational correction of the amount of the phase angle of the preceding likelihood value is carried out. Then, by assigning, for example, "0" to control signal C0, likelihood value L (b0=0) when bit b0 is "0" is supplied as output. When "1" is assigned to control signal C0, likelihood value L (b1=0) when bit b1 is "0" is supplied as output.

Figure 24:
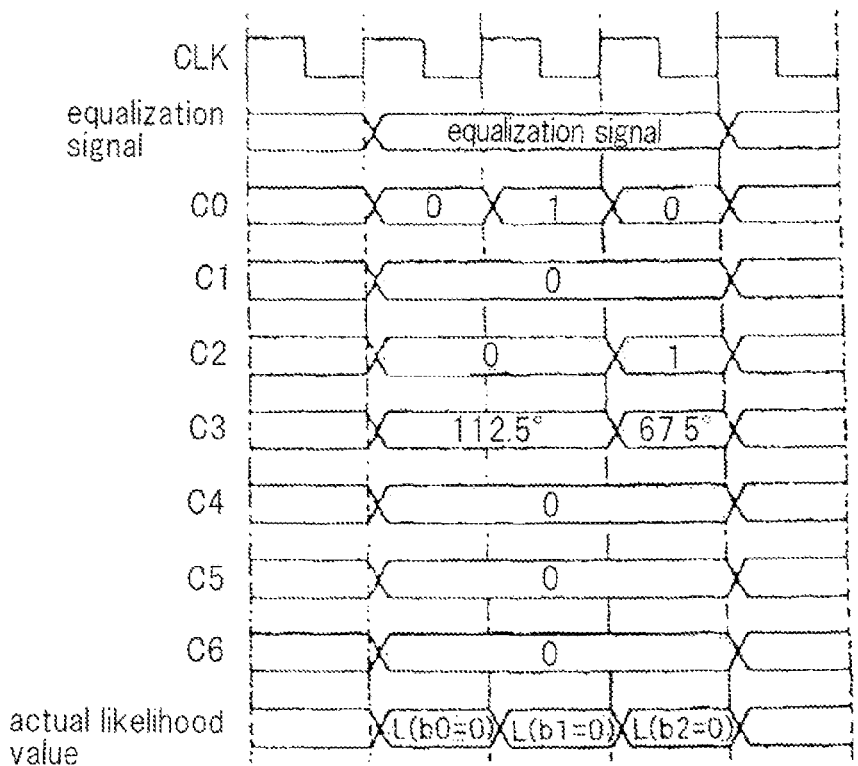
FIG. 24 is a timing chart showing the likelihood value calculation operation in 8PSK modulation.

FIG. 24 shows an example of the likelihood value calculation timing of 8 PSK modulation when bit assignment as shown in FIG. 10 is implemented.

When "0" is assigned to control signal C0, "0" is assigned to control signal C2, and a parameter for carrying out rotational correction of 112.5° in the clockwise direction is assigned to control signal C3, likelihood value L (b0=0) when bit b0 is "0" is supplied as output.

When "1" is assigned to control signal C0, "0" is assigned to control signal C2, and a parameter for carrying out rotational correction of 112.5° in the clockwise direction is assigned to control signal C3, likelihood value L (b1=0) when bit b1 is "0" is supplied as output.

When "0" is assigned to control signal C0, "1" is assigned to control signal C2, and a parameter for carrying out rotational correction of 67.5° in the clockwise direction is assigned to control signal C3, likelihood value L (b2=0) when bit b2 is "0" is supplied as output.

Figure 25:
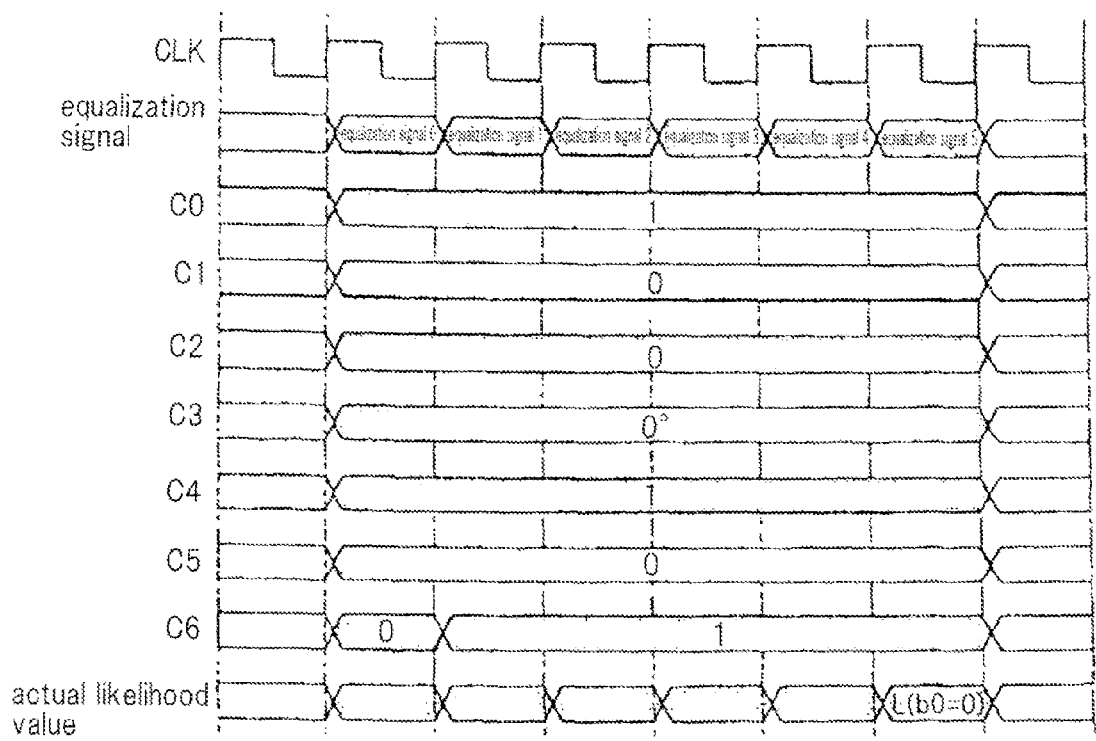
FIG. 25 is a timing chart showing the likelihood value calculation operation in FSK modulation.

FIG. 25 shows an example of the likelihood value calculation timing of FSK modulation.

By assigning "1" to control signal C4, rotational correction of the amount of the phase angle of the preceding likelihood value is carried out. Then, the Q-axis component following rotational correction is found by assigning "1" to control signal C0, the provisional likelihood values of the time period and the time period of the preceding cycle are accumulated by assigning "1" to control signal C6, and finally, the actual likelihood value is supplied as output.

In the likelihood value calculation device described above, operation control unit 105 holds control patterns (more specifically, the control signal patterns shown in FIGS. 18-25) for controlling the operations of each of equalization signal rotation unit 101, likelihood value calculation unit 102, arithmetic inversion unit 103, and likelihood value accumulation unit 104 for each combination of a radio mode and modulation mode. Operation control unit 105 generates control signals for controlling each of equalization signal rotation unit 101, likelihood value calculation unit 102, arithmetic inversion unit 103, and likelihood value accumulation unit 104 in accordance with the control pattern that was designated from among the control patterns that are held.

The above-described configuration can handle a plurality of radio modes and a plurality of modulation modes and allows equalization signal rotation unit 101, likelihood value calculation unit 102, arithmetic inversion unit 103, and likelihood value accumulation unit 104 to be used in common for each combination of these radio modes and modulation modes. Accordingly, the amount of hardware can be decreased and the circuit area can be made more compact.

A radio system that is provided with the likelihood value calculation device of the present invention is next described.

Figure 26:
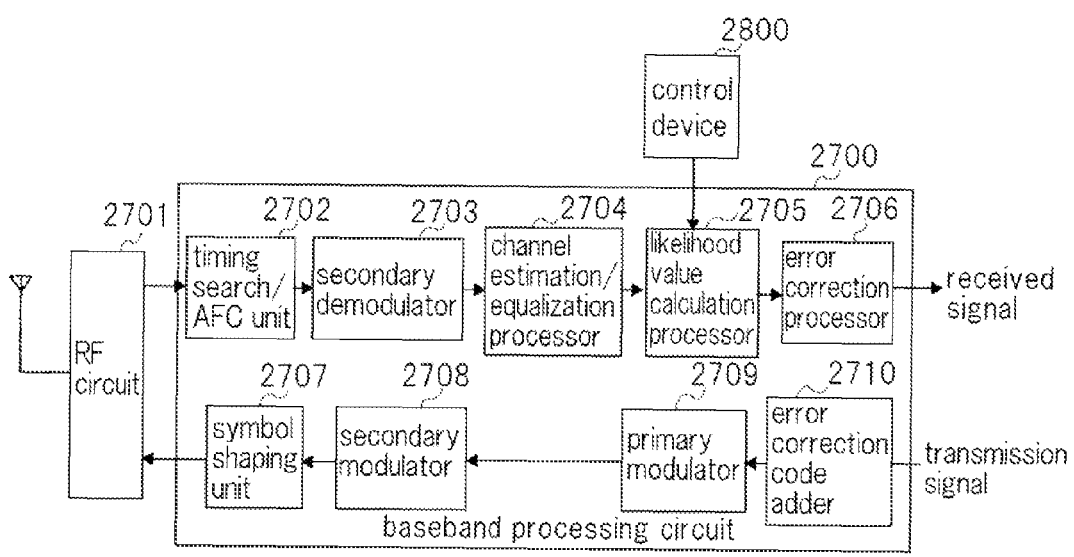
FIG. 26 is a block diagram showing an example of the configuration of a radio system in which the likelihood value calculation device of the present invention is applied.

FIG. 26 shows the configuration of this radio system. The radio system includes baseband processing circuit 2700, RF circuit 2701, and control device 2800.

Baseband processing circuit 2700 includes: timing search/AFC unit 2702, secondary demodulator 2703, channel estimation/equalization processor 2704, likelihood value calculation processor 2705, error correction processor 2706, symbol shaping unit 2707, secondary modulator 2708, primary modulator 2709, and error correction code adder 2710.

A received RF signal is converted to a received baseband signal in RF circuit 2701. The received baseband signal is supplied from RF circuit 2701 to baseband processing circuit 2700.

Timing search/AFC unit 2702 subjects the received baseband signal from RF circuit 2701 to frequency correction and frame timing correction. Secondary demodulator 2703 subjects the signal from timing search/AFC unit 2702 to secondary demodulation (for example, an FFT process in OFDM).

Channel estimation/equalization processor 2704 subjects the demodulated signal from second demodulator 2703 to a channel estimation and equalization process.

Likelihood value calculation processor 2705 is made up by the previously-described likelihood value calculation device of the present invention. Likelihood value calculation processor 2705 calculates the likelihood value of the equalization signal from channel estimation/equalization processor 2704. Error correction processor 2706 performs error correction based on the likelihood value from likelihood value calculation processor 2705. The received signal is obtained by means of this error correction.

Control device 2800 holds parameters for controlling the operations of likelihood value calculation processor 2705 for each combination of a radio mode and modulation mode and sets to likelihood value calculation processor 2705 the parameters that correspond to the combination of radio mode and modulation mode that is in use. In likelihood value calculation processor 2705, the control pattern that corresponds to the radio mode and modulation mode that are in use is designated from among the control patterns that are held by means of these parameters.

The transmission signal is supplied to error correction code adder 2710. Error correction code adder 2710 adds the error correction code to the transmission signal that was received as input. Primary modulator 2709 subjects the signal from error correction code adder 2710 to primary modulation. Secondary modulator 2708 subjects the signal from primary modulator 2709 to secondary modulation.

Symbol shaping unit 2707 shapes the signal from secondary modulator 2708. The signal that is supplied as output from this symbol shaping unit 2707 is supplied to RF circuit 2701 as the transmission baseband signal. The transmission baseband signal from symbol shaping unit 2707 is converted to a transmission RF signal in RF circuit 2701.

According to the radio system described hereinabove, likelihood value calculation processor 2705 is able to handle a plurality of radio modes and a plurality of modulation modes, and a likelihood value calculation processor is therefore not required for each combination of a radio mode and modulation mode. As a result, the circuit area can be made more compact and power consumption can be reduced compared to a device in which a plurality of likelihood value calculation processors is provided.

Another Exemplary Embodiment

Figure 27:
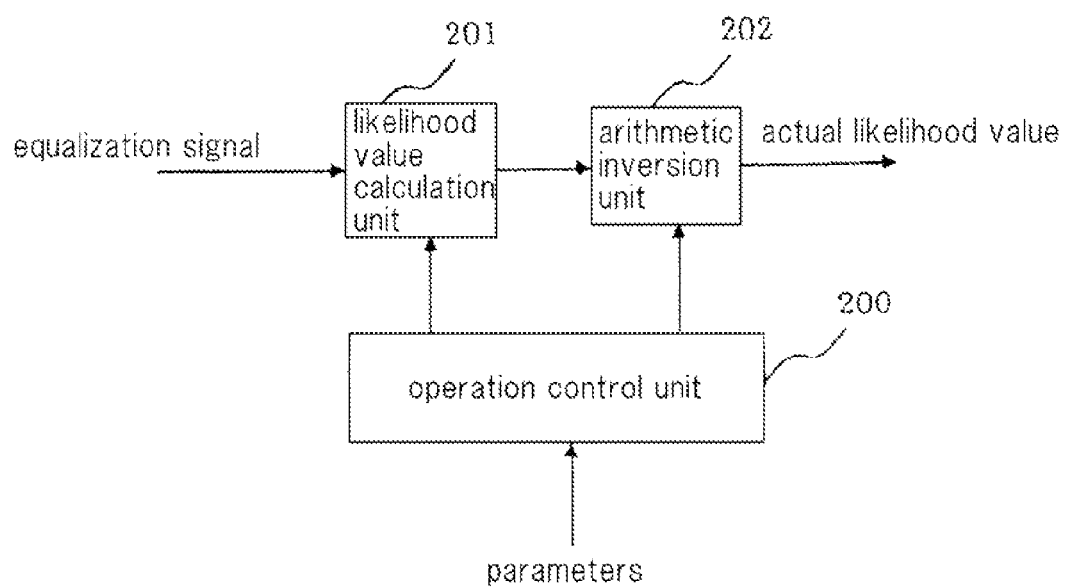
FIG. 27 is a block diagram showing the configuration of a likelihood value calculation device that is another exemplary embodiment of the present invention.

FIG. 27 is a block diagram showing the configuration of a likelihood value calculation device that is another exemplary embodiment of the present invention. This likelihood value calculation device includes operation control unit 200, likelihood value calculation unit 201, and arithmetic inversion unit 202.

Likelihood value calculation unit 201: takes as input an equalization signal of a modulated signal prescribed by a constellation in which each signal point is mapped onto a two-dimensional plane composed of an I-axis and a Q-axis, and moreover, in which values made up from bit sequences are assigned to each signal point; selects one or both of the I-axis component and Q-axis component of the equalization signal that was received as input in accordance with a first control signal; and based on the selected component, calculates a provisional likelihood value in which the bit value of each signal point is "0" for each bit position of the bit sequence. This likelihood value calculation unit 201 is basically the same as likelihood value calculation unit 102 shown in FIG. 1.

In accordance with a second control signal, arithmetic inversion unit 202 supplies without alteration the provisional likelihood value that was supplied from likelihood value calculation unit 201 for each bit position. Alternatively, arithmetic inversion unit 202 subjects the provisional likelihood value that was supplied from likelihood value calculation unit 201 to arithmetic inversion based on inversion positions that are designated on the two-dimensional plane and supplies the likelihood value that follows inversion. This arithmetic inversion unit 202 is basically the same as arithmetic inversion unit 103 shown in FIG. 1.

Operation control unit 200 holds control patterns for controlling the operations of at least likelihood value calculation unit 201 and arithmetic inversion unit 202 for each combination of a radio mode and modulation mode, and generates a first and second control signal in accordance with the control pattern that is designated from among these control patterns.

The likelihood value calculation device of this additional exemplary embodiment is able to cope with a plurality of radio modes and a plurality of modulation modes and is able to use, for example, the circuits for likelihood value calculation and arithmetic inversion in common for each of these combinations of radio mode and modulation mode. As a result, this likelihood value calculation device enables a reduction of the amount of hardware and a decrease of the circuit area.

In the likelihood value calculation device of this additional present exemplary embodiment, an equalization signal rotation unit may be provided in the input stage of likelihood value calculation unit 201. In accordance with a third control signal, this equalization signal rotation unit applies rotational correction according to a designated phase angle to the equalization signal that is received as input, or alternatively, supplies the equalization signal that was received as input without alteration.

In the case described above, control patterns further include patterns for controlling the operations of the equalization signal rotation unit, and operation control unit 200 generates a third control signal according to the designated control pattern.

In the likelihood value calculation device of this additional exemplary embodiment, a likelihood value accumulation unit may be further provided that, in accordance with a fourth control signal, accumulates likelihood values supplied from arithmetic inversion unit 202 or supplies the likelihood values without alteration.

In the case described above, the control patterns further include patterns for controlling the operations of the likelihood value accumulation unit, and operation control unit 200 generates the fourth control signal in accordance with the control pattern that has been designated.

The likelihood value calculation device of this additional exemplary embodiment may be applied in likelihood value calculation processor 2705 of the radio system shown in FIG. 26.

This configuration also exhibits the same action and effect as the previously described radio system.

The likelihood value calculation device of the present invention as described hereinabove is able to obtain the following effects.

Likelihood value calculation processing that can handle a variety of radio modes and modulation modes is possible in a processor such as a DSP (Digital Signal Processor). In this case, however, the increased load on the processor resulting from likelihood value calculation processing that deals with a variety of radio modes and modulation modes causes, for example, delays in other processing carried out by the processor. According to the present invention, the likelihood value calculation device adopts a configuration that handles a plurality of radio modes and a plurality of modulation modes, whereby the processor does not need to carry out this processing.

As described hereinabove, the likelihood value calculation device according to one aspect of the present invention includes a likelihood value calculation unit, an arithmetic inversion unit, and an operation control unit. The likelihood value calculation unit: takes as input an equalization signal of a modulated signal that is prescribed by a constellation in which signal points are mapped onto a two-dimensional plane composed of an I-axis and a Q-axis, and moreover, in which a value made up from a bit sequence is assigned to each signal point; selects, in accordance with a first control signal, one or both of an I-axis component and a Q-axis component of the equalization signal that was received as input; and, based on the selected component, calculates provisional likelihood value at which each bit value of each signal point is "0" for each bit position of the bit sequences. In accordance with a second control signal, the arithmetic inversion unit either supplies without alteration the provisional likelihood values that were supplied from the likelihood value calculation unit for each of the bit positions, or alternatively, subjects the provisional likelihood values that were supplied from the likelihood value calculation unit to arithmetic inversion that is based on inversion positions that are designated on the two-dimensional plane and supplies the likelihood values that follow inversion. The operation control unit holds, for each combination of radio mode and modulation mode, a control pattern for controlling the operations of at least the likelihood value calculation unit and the arithmetic inversion unit and generates the first and second control signals in accordance with the control pattern that is designated from among these control patterns.

According to the above-described configuration, a plurality of radio modes and a plurality of modulation modes can be handled, and circuits for, for example, likelihood value calculation and arithmetic inversion can be used in common for each combination of these radio modes and modulation modes. As a result, the amount of hardware can be reduced and the circuit area can be decreased.

Although the present invention has been described hereinabove with reference to exemplary embodiments, the present invention is not limited to the above-described exemplary embodiments. The configuration and operation of the present invention is open to various modifications within a scope that does not depart from the gist of the present invention that will be clear to one of ordinary skill in the art.

This application claims the benefits of priority based on Japanese Patent Application No. 2009-134057 for which application was submitted on Jun. 3, 2009 and incorporates by citation all of the disclosures of that application.

What is claimed is:

1. A likelihood value calculation device comprising:
    a likelihood value calculation unit comprising a processor that: takes as input an equalization signal of a modulated signal that is prescribed by a constellation in which signal points are mapped onto a two-dimensional plane composed of an I-axis and a Q-axis, and moreover, in which a value composed of a bit sequence is assigned to each signal point; selects according to a first control signal one or both of the I-axis component and Q-axis component of said equalization signal that was received as input; and, based on the selected component, calculates a provisional likelihood value in which the bit value of each of said signal points is 0 for each bit position of said bit sequence;
    an arithmetic inversion unit that, according to a second control signal, supplies as output without alteration the provisional likelihood value that was supplied as output from said likelihood value calculation unit for each of said bit positions, or subjects the provisional likelihood value that was supplied from said likelihood value calculation unit to arithmetic inversion based on inversion positions that are designated on said two-dimensional plane and supplies the likelihood value that follows inversion as output; and an operation control unit that holds, for each combination of a radio mode and a modulation mode, a control pattern that is used to control operations of at least said likelihood value calculation unit and said arithmetic inversion unit and that generates said first and second control signals in accordance with a control pattern that was designated from among the held control patterns, said radio mode being defined based on a communication system standard.

2. The likelihood value calculation device as set forth in claim 1, further comprising:

an equalization signal rotation unit that is provided in the input stage of said likelihood value calculation unit and that, in accordance with a third control signal, subjects said equalization signal that was received as input to rotational correction according to a phase angle that is designated or supplies as output without alteration said equalization signal that was received as input;

wherein:

said control patterns further include patterns that are used to control operations of said equalization signal rotation unit; and said operation control unit generates said third control signal in accordance with said designated control pattern.

3. The likelihood value calculation device as set forth in claim 1, further comprising:

a likelihood value accumulation unit that, in accordance with a fourth control signal, accumulates likelihood values supplied from said arithmetic inversion unit or supplies as output said likelihood values without alteration;

wherein:

said control patterns include a pattern that is used to control operations of said likelihood value accumulation unit; and said operation control unit generates said fourth control signal in accordance with said designated control pattern.

4. The likelihood value calculation device as set forth in claim 1, wherein:

said likelihood value calculation unit includes:
first and second likelihood value calculation circuits; and
a selector that selects output of one of said first and second likelihood value calculation circuits;
said first likelihood value calculation circuit includes:
a first selector that selects as output either the I-axis component or the Q-axis component of said equalization signal that was received as input;
a first absolute value computing unit that computes the absolute value of the output value of said first selector;
A shifter that supplies as output a first value obtained by multiplying a received weighting coefficient by 2 and a second value obtained by multiplying said weighting coefficient by 4;
a first subtractor that subtracts the first value that was supplied from said shifter from an output value of said first absolute value computing unit;
a second absolute value computing unit that computes the absolute value of an output value of said first subtractor;
a second subtractor that subtracts the output value of said first absolute value computing unit from the second value that was supplied from said shifter;

a third subtractor that subtracts an output value of said second absolute value computing unit from the first value supplied from said shifter; and
a second selector that selects as output of said first likelihood value calculation circuit one of the output value of said first selector, an output value of said second subtractor, and an output value of said third subtractor;
said second likelihood value calculation circuit includes:
a first comparator that compares the values of the I-axis component and the Q-axis component of said equalization signal that was received as input;
a first arithmetic inversion circuit that inverts the value of the Q-axis component of said equalization signal that was received as input;
a second comparator that compares the value of the I-axis component of said equalization signal that was received as input and an output value of said first arithmetic inversion circuit;
an XOR circuit that takes the XOR of output values of said first and second comparators;
a third selector that, in accordance with the computation result of said XOR circuit, selects as output either the I-axis component or the Q-axis component of said equalization signal that was received as input;
a second arithmetic inversion circuit that inverts the output value of said third selector; and
a fourth selector that, in accordance with the output value of said second comparator, selects as the output of said second likelihood value calculation circuit either the output value of said third selector or an output value of said second arithmetic inversion circuit; and
said operation control unit controls each of said selector and said first and second selectors in accordance with said designated control pattern.

5. The likelihood value calculation device as set forth in claim 1, wherein:

said arithmetic inversion unit includes:
an arithmetic inversion computing unit that inverts the provisional likelihood value that was supplied from said likelihood value calculation unit; and
a selector that selects as the output of said arithmetic inversion unit either the provisional likelihood value that was supplied from said likelihood value calculation unit or an output value of said arithmetic inversion computing unit; and
said operation control unit controls said selector in accordance with said designated control pattern.

6. The likelihood value calculation device as set forth in claim 2; wherein said equalization signal rotation unit includes:

a first register that holds the value of the I-axis component of said equalization signal that was received as input;
a second register that holds the value of the Q-axis component of said equalization signal that was received as input;
a rotator ROM that supplies each of the I-axis component and the Q-axis component for rotational correction;
a first selector that selects either an output value of said first register or the value of the I-axis component for rotational correction that was supplied from said rotator ROM;
a second selector that selects either an output value of said second register or the value of the Q-axis component for rotational correction that was supplied from said rotator ROM;

a first multiplier that multiplies the value of the I-axis component of said equalization signal that was received as input and an output value of said first selector;

a second multiplier that multiplies the value of the Q-axis component of said equalization signal that was received as input and an output value of said second selector;

a third multiplier that multiplies the value of the Q-axis component of said equalization signal that was received as input and the output value of said first selector;

a fourth multiplier that multiplies the value of the I-axis component of said equalization signal that was received as input and the output value of said second selector;

an adder that adds output values of said first and second multipliers; and a subtractor that subtracts an output value of said fourth multiplier from an output value of said third multiplier;

said operation control unit controls each of said rotator ROM and said first and second selectors in accordance with said designated control pattern.

7. The likelihood value calculation device as set forth in claim 3, wherein:

said likelihood value accumulation unit includes:

a selector in which one input is set to "0";

an adder that supplies as output an actual likelihood value obtained by adding an output value of said selector to the output value of said arithmetic inversion unit; and a register that stores the actual likelihood value that was supplied from said adder;

an output value of said register is supplied to the other input of said selector; and said operation control unit controls the selection of input in said selector in accordance with said designated control pattern.

8. A likelihood value calculation method comprising:

receiving an equalization signal of a modulated signal that is prescribed by a constellation in which signal points are mapped onto a two-dimensional plane composed of an I-axis and a Q-axis, and moreover, in which a value composed of a bit sequence is assigned to each signal point;

in accordance with a first control signal, selecting one or both of the I-axis component and Q-axis component of said equalization signal that was received, and based on the component that was selected, calculating a provisional likelihood value in which the bit value of each of said signal points is 0 for each bit position of said bit sequence;

in accordance with a second control signal, supplying as output said provisional likelihood value without alteration for each of said bit positions, or subjecting said provisional likelihood value to an arithmetic inversion based on inversion positions designated on said two-dimensional plane and supplying as output the likelihood value that follows inversion; and holding, for each combination of a radio mode and modulation mode, a control pattern that is used to control the operations of at least the calculation of said provisional likelihood values and the arithmetic inversion and generating said first and second control signals in accordance with a control pattern that was designated from among the control patterns that are held, said radio mode being defined based on a communication system standard.

9. A radio system that is able to handle each combination of a radio mode based on a communication system standard and a modulation mode, said system comprising:

the likelihood value calculation device according to claim 1; and a control device that holds parameters that are used to control operations of said likelihood value calculation device for the each combination of the radio mode and the modulation mode and that selects, from the held parameters, a parameter that corresponds to a combination of the radio mode and the modulation mode that is used by said radio system and sets the selected parameter to said likelihood value calculation device.

* * * * *